United States Patent
Chung et al.

(10) Patent No.: US 10,019,188 B2
(45) Date of Patent: Jul. 10, 2018

(54) STORAGE DEVICES, MEMORY SYSTEMS AND OPERATING METHODS TO SUPPRESS OPERATING ERRORS DUE TO VARIATIONS IN ENVIRONMENTAL CONDITIONS

(71) Applicants: Woonjae Chung, Gunpo-si (KR); HanShin Shin, Yongin-si (KR)

(72) Inventors: Woonjae Chung, Gunpo-si (KR); HanShin Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/016,464

(22) Filed: Feb. 5, 2016

(65) Prior Publication Data
US 2016/0239235 A1   Aug. 18, 2016

(30) Foreign Application Priority Data
Feb. 17, 2015   (KR) .................. 10-2015-0023899

(51) Int. Cl.
| | | |
|---|---|---|
| *G11C 7/04* | (2006.01) | |
| *G06F 3/06* | (2006.01) | |
| *G11C 16/04* | (2006.01) | |
| *G11C 16/28* | (2006.01) | |
| *G11C 16/32* | (2006.01) | |

(52) U.S. Cl.
CPC .......... *G06F 3/0629* (2013.01); *G06F 3/0604* (2013.01); *G06F 3/0679* (2013.01); *G11C 7/04* (2013.01); *G11C 16/0483* (2013.01); *G11C 16/28* (2013.01); *G11C 16/32* (2013.01)

(58) Field of Classification Search
None
See application file for complete search history.

(56) References Cited

U.S. PATENT DOCUMENTS

| | | |
|---|---|---|
| 6,643,792 B1 | 11/2003 | Kurosawa |
| 7,061,804 B2 | 6/2006 | Chun et al. |
| 7,064,994 B1 | 6/2006 | Wu |
| 7,158,911 B2 | 1/2007 | Gunther et al. |
| 7,493,228 B2 | 2/2009 | Kwa et al. |
| 7,679,133 B2 | 3/2010 | Son et al. |
| 8,037,234 B2 | 10/2011 | Yu et al. |
| 8,510,740 B2 | 8/2013 | Salsbery et al. |
| 8,553,466 B2 | 10/2013 | Han et al. |
| 8,559,235 B2 | 10/2013 | Yoon et al. |
| 8,644,099 B2 | 2/2014 | Cometti et al. |

(Continued)

FOREIGN PATENT DOCUMENTS

| | | |
|---|---|---|
| KR | 10-2013-0080305 A | 7/2013 |
| KR | 10-2014-0015880 A | 2/2014 |

(Continued)

*Primary Examiner* — Son Dinh
*Assistant Examiner* — Sultana Begum
(74) *Attorney, Agent, or Firm* — Harness, Dickey & Pierce, P.L.C.

(57) ABSTRACT

In a method for operating a NAND flash memory system, a temperature sensing device detects a decrease in temperature of the NAND flash memory system below a first threshold temperature level, and a clock control unit adjusts an operating condition for a memory access operation in response to detecting the decrease in the temperature below the first threshold temperature level.

17 Claims, 26 Drawing Sheets

(56) References Cited

U.S. PATENT DOCUMENTS

| | | |
|---|---|---|
| 8,654,587 B2 | 2/2014 | Yoon et al. |
| 8,737,136 B2 | 5/2014 | Cometti |
| 8,806,165 B2 | 8/2014 | Selfin et al. |
| 8,929,140 B2 | 1/2015 | Nagashima |
| 8,996,330 B2 | 3/2015 | Anderson et al. |
| 2005/0078537 A1* | 4/2005 | So ............... G11C 5/143 365/211 |
| 2009/0091996 A1* | 4/2009 | Chen ............ G11C 7/04 365/212 |
| 2009/0193184 A1 | 7/2009 | Yu et al. |
| 2009/0228637 A1 | 9/2009 | Moon et al. |
| 2010/0023678 A1* | 1/2010 | Nakanishi ........ G06F 1/206 711/103 |
| 2010/0293305 A1* | 11/2010 | Park ............... G11C 7/04 710/33 |
| 2011/0233648 A1 | 9/2011 | Seol et al. |
| 2013/0073822 A1 | 3/2013 | Sandel et al. |
| 2013/0169347 A1 | 7/2013 | Kim et al. |
| 2013/0185612 A1 | 7/2013 | Lee et al. |
| 2013/0198439 A1 | 8/2013 | Kurotsuchi et al. |
| 2013/0297094 A1 | 11/2013 | Yao et al. |
| 2014/0032949 A1 | 1/2014 | Kim et al. |
| 2014/0075241 A1 | 3/2014 | Oh et al. |
| 2014/0185388 A1* | 7/2014 | Vaysman ........ G06F 13/4086 365/185.23 |
| 2014/0198573 A1 | 7/2014 | Jung et al. |
| 2016/0086675 A1* | 3/2016 | Ray ............... G11C 16/26 365/185.12 |
| 2016/0092130 A1* | 3/2016 | Choi ............... G11C 7/04 711/156 |
| 2016/0132256 A1* | 5/2016 | Jung ............... G06F 3/0614 711/103 |

FOREIGN PATENT DOCUMENTS

| | | |
|---|---|---|
| KR | 10-2014-0021283 A | 2/2014 |
| KR | 10-2014-0032790 A | 3/2014 |

* cited by examiner

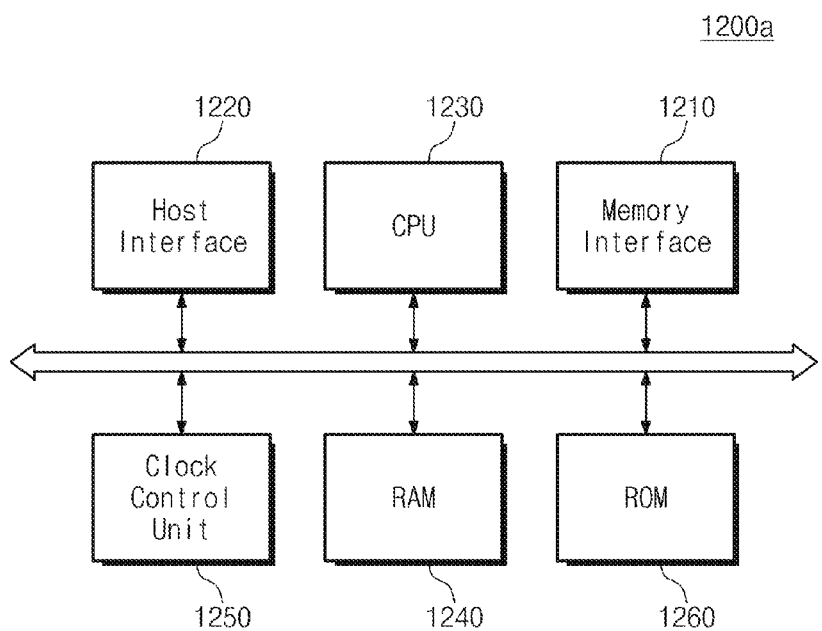
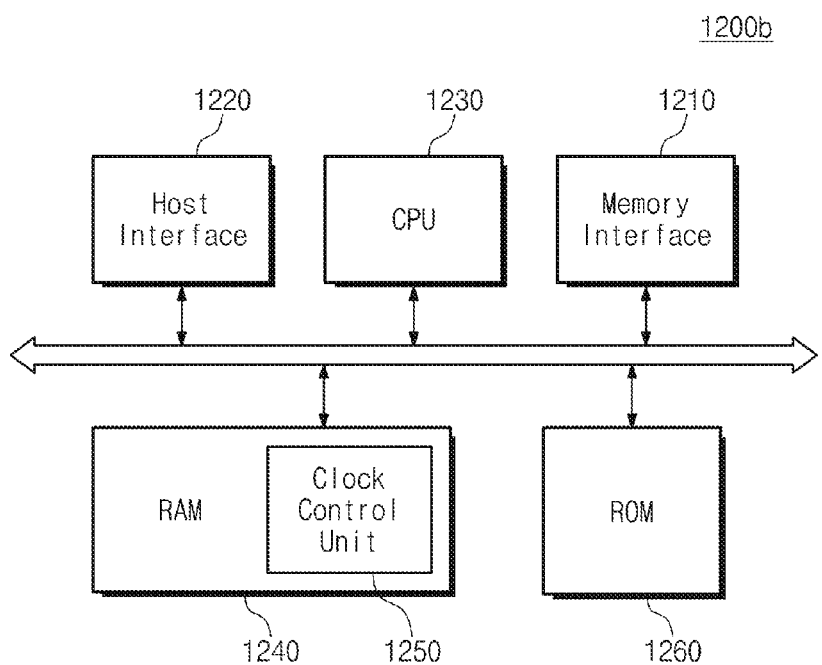

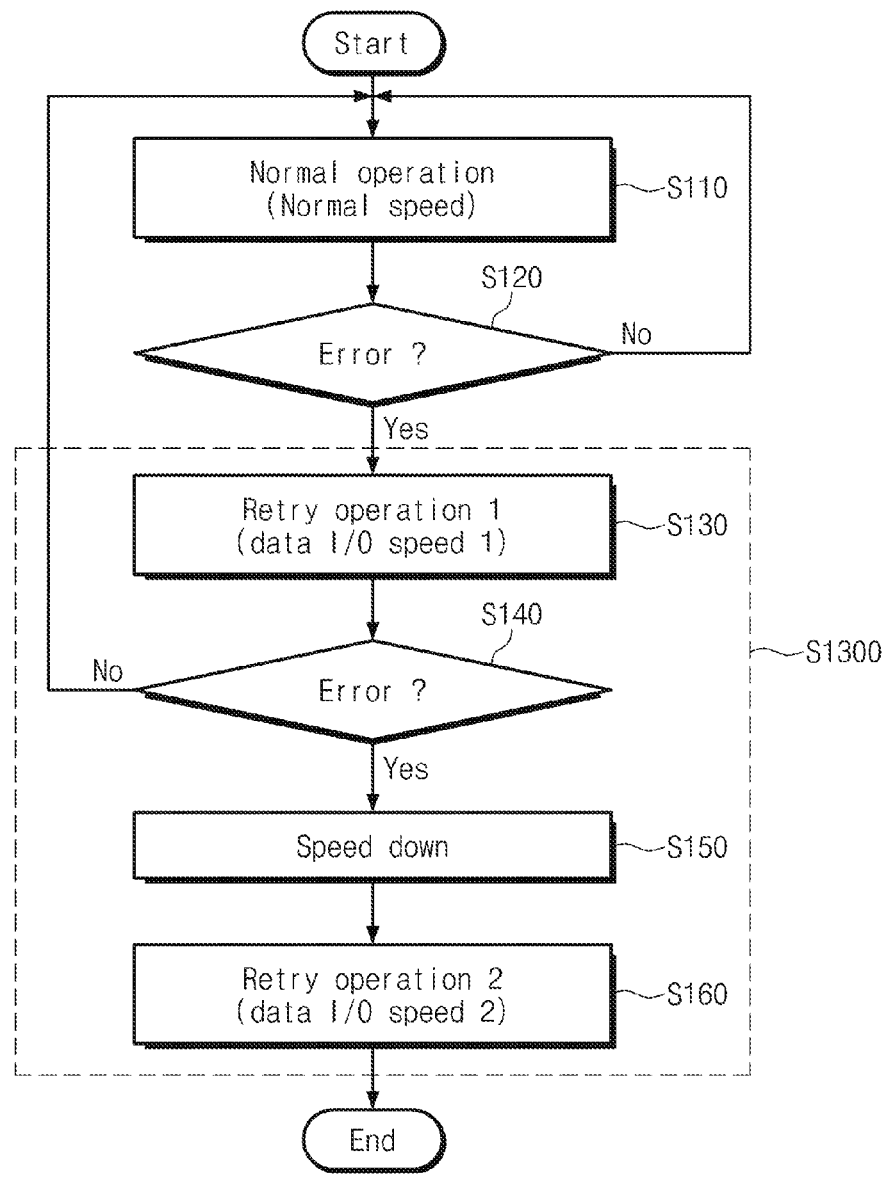

| VDD | Temperature | Speed | | |
|---|---|---|---|---|
| | | CCC(Mbps) | BBB(Mbps) | AAA(Mbps) |
| 1.7V | Warm Temp. (room temp.) | Pass | Pass | Pass |
| | Cold Temp. (-25℃) | 36% Error | 64% Error | 100% Error |
| | | 64% Success | 36% Success | |

STORAGE DEVICES, MEMORY SYSTEMS AND OPERATING METHODS TO SUPPRESS OPERATING ERRORS DUE TO VARIATIONS IN ENVIRONMENTAL CONDITIONS

CROSS-REFERENCE TO RELATED APPLICATIONS

This application claims priority under 35 U.S.C. § 119 to Korean Patent Application No. 10-2015-0023899 filed Feb. 17, 2015, in the Korean Intellectual Property Office, the entire contents of which are incorporated herein by reference.

BACKGROUND

Field

One or more example embodiments of inventive concepts described herein relate to semiconductor memory devices, for example, storage devices, memory controllers, memory systems and/or operating methods thereof.

Description of Related Art

Related art semiconductor memory devices include volatile memory devices such as dynamic random access memory (DRAM), static RAM (SRAM), etc., and nonvolatile memory devices such as electrically erasable programmable read-only memory (EEPROM), ferroelectric RAM (FRAM), phase-change RAM (PRAM), magnetic RAM (MRAM), flash memory, etc. Volatile memory devices lose data stored therein at power-off, whereas nonvolatile memory devices retain data stored therein even at power-off.

Related art flash memory devices have relatively fast programming speeds, relatively low power consumption, relatively high storage capacity, etc. Accordingly, flash memory devices are used relatively widely as data storage mediums.

SUMMARY

One or more example embodiments of inventive concepts provide storage devices, memory controllers, memory systems and/or operating methods thereof, capable of suppressing operating errors and/or changes in performance due to variations in environmental conditions.

At least one example embodiment provides method for operating a NAND flash memory system, the method comprising: detecting a decrease in temperature of the NAND flash memory system below a first threshold temperature level; and adjusting an operating condition for a memory access operation in response to detecting the decrease in the temperature below the first threshold temperature level.

At least one other example embodiment provides a NAND flash memory system comprising: a temperature sensor configured to detect a decrease in temperature of the NAND flash memory system below a first threshold temperature level; and a control circuit configured to adjust an operating condition for a memory access operation in response to the detected decrease in the temperature below the first threshold temperature level.

According to at least some example embodiments, the operating condition may be one of (i) a data I/O speed for the memory access operation, (ii) a read voltage level for the memory access operation, and (iii) a drive strength for the NAND flash memory system.

According to at least some example embodiments, the operating condition may be a data I/O speed for the memory access operation; and the adjusting may include decreasing the data I/O speed for the memory access operation from a first data I/O speed to a second data I/O speed in response to detecting the decrease in the temperature of the NAND flash memory system below the first threshold temperature level.

The method may further include: detecting a further decrease in the temperature of the NAND flash memory system below a second threshold temperature level, the second threshold temperature level being less than the first threshold temperature level; and decreasing the data I/O speed from the second data I/O speed to a third I/O speed in response to detecting the further decrease in the temperature of the NAND flash memory system below the second threshold temperature level.

The method may further include: detecting an increase in the temperature of the NAND flash memory system above the first threshold temperature level; and increasing the data I/O speed from the second data I/O speed to the first data I/O speed in response to detecting the increase in the temperature of the NAND flash memory system above the first threshold temperature level.

According to at least some example embodiments, the operating condition may be a read voltage level for the memory access operation; and the adjusting may include increasing the read voltage level from a first read voltage level to a second read voltage level for the memory access operation in response to detecting the decrease in the temperature of the NAND flash memory system below the first threshold temperature level.

The method may further include: detecting a further decrease in the temperature of the NAND flash memory system below a second threshold temperature level, the second threshold temperature level being less than the first threshold temperature level; and increasing the read voltage level from the second read voltage level to a third read voltage level in response to detecting the further decrease in the temperature of the NAND flash memory system below the second threshold temperature level.

The method may further include: detecting an increase in the temperature of the NAND flash memory system above the first threshold temperature level; and decreasing the read voltage level from the second read voltage level to the first read voltage level in response to detecting the increase in the temperature of the NAND flash memory system above the first threshold temperature level.

The adjusting may adjust the read voltage level according to a valley search operation.

According to at least some example embodiments, the operating condition may be a drive strength for the NAND flash memory system; and the adjusting may include increasing the drive strength from a first drive strength to a second drive strength in response to detecting the decrease in the temperature of the NAND flash memory system below the first threshold temperature level.

The method may further include: detecting a further decrease in the temperature of the NAND flash memory system below a second threshold temperature level, the second threshold temperature level being less than the first threshold temperature level; and increasing the drive strength from the second drive strength to a third rive strength in response to detecting the further decrease in the temperature of the NAND flash memory system below the second threshold temperature level.

The method may further include: detecting an increase in the temperature of the NAND flash memory system above the first threshold temperature level; and decreasing the drive strength from the second drive strength to the first drive strength in response to detecting the increase in the temperature of the NAND flash memory system above the first threshold temperature level.

According to at least some example embodiments, the NAND flash memory system may be a three-dimensional memory system including three-dimensional VNAND memory array. The three-dimensional VNAND memory array may be monolithically formed in one or more physical levels of memory cells having active areas above a silicon substrate.

The three-dimensional VNAND memory array may include a plurality of memory cells, each of the plurality of memory cells including a charge trap layer. At least one of word lines and bit lines in the three-dimensional VNAND memory array may be shared between levels of the three-dimensional VNAND memory array.

According to at least some example embodiments, the memory access operation may be one of a read operation and a write operation.

At least one other example embodiment provides a method for operating a memory system, the method comprising: adjusting a data I/O speed for a memory access operation based on temperature information associated with the memory system. The adjusting adjusts the data I/O speed to a first data I/O speed if the temperature information indicates that a temperature of the memory system is below a first threshold temperature level; adjusts the data I/O speed to a second data I/O speed if the temperature information indicates that the temperature of the memory system is between the first threshold temperature level and a second threshold temperature level; and adjusts the data I/O speed to a third data I/O speed if the temperature information indicates that the temperature of the memory system is greater than the second threshold temperature level.

At least one other example embodiment provides a memory system comprising: a control circuit configured to adjust a data I/O speed for a memory access operation based on temperature information associated with the memory system. The control circuit is configured to: adjust the data I/O speed to a first data I/O speed if the temperature information indicates that a temperature of the memory system is below a first threshold temperature level; adjust the data I/O speed to a second data I/O speed if the temperature information indicates that the temperature of the memory system is between the first threshold temperature level and a second threshold temperature level; and adjust the data I/O speed to a third data I/O speed if the temperature information indicates that the temperature of the memory system is greater than the second threshold temperature level.

The first data I/O speed and the third data I/O speed may be less than the second data I/O speed.

The memory access operation may be one of a read operation and a write operation.

According to at least some example embodiments, the adjusting may include adjusting a frequency of a clock for the memory access operation to change the data I/O speed for the memory access operation.

The memory access operation may be a read operation; and the method may further include determining a read voltage for the read operation based on the adjusted data I/O speed.

The determining may determine the read voltage using a valley search operation.

At least one other example embodiment provides a method for operating a NAND flash memory system, the method comprising: detecting a decrease in a temperature of the NAND flash memory system below a first threshold temperature level; and decreasing at least one of a clock frequency and a data I/O speed for a memory access operation in response to detecting the decrease in the temperature of the NAND flash memory system below the first threshold temperature level.

At least one other example embodiment provides a NAND flash memory system comprising: a temperature sensor configured to detect a decrease in temperature of the NAND flash memory system below a first threshold temperature level; and a clock control circuit configured to decrease at least one of a clock frequency and a data I/O speed for a memory access operation in response to the detected decrease in the temperature below the first threshold temperature level.

According to at least some example embodiments, the method may further include: detecting an error in performing the memory access operation; and wherein the decreasing decreases the at least one of the clock frequency and the data I/O speed in response to detecting the error.

The method may further include: detecting a first error in performing a first iteration of the memory access operation; adjusting, in response to detecting the first error, an operating condition for a second iteration of the memory access operation, the operating condition being one of (i) a read voltage level for the memory access operation, and (ii) a drive strength for the NAND flash memory system; and performing the second iteration of the memory access operation according to the adjusted operating condition and the decreased at least one of the clock frequency and the data I/O speed.

The method may further include: detecting a first error in performing a first iteration of the memory access operation; adjusting, in response to detecting the first error, an operating condition for a second iteration of the memory access operation, the operating condition being one of (i) a read voltage level for the memory access operation, and (ii) a drive strength for the NAND flash memory system; performing the second iteration of the memory access operation according to the adjusted operating condition; detecting a second error in performing the second iteration of the memory access operation; and wherein the decreasing decreases the at least one of the clock frequency and the data I/O speed in response to detecting the second error.

The decreasing may decrease the at least one of the clock frequency and the data I/O speed from a first level to a second level; and the method may further include: detecting a decrease in the temperature of the NAND flash memory system below a second threshold temperature level, the second threshold temperature level being less than the first threshold temperature level; and decreasing the at least one of the clock frequency and the data I/O speed for the memory access operation from the second level to a third level in response to detecting the decrease in the temperature of the NAND flash memory system below the second threshold temperature level.

The decreasing may decrease the at least one of the clock frequency and the data I/O speed from a first level to a second level; and the method may further include: detecting an increase in the temperature of the NAND flash memory system above the first threshold temperature level; and increasing the at least one of the clock frequency and the data I/O speed from the second level to the first level in response to detecting the increase in the temperature of the NAND flash memory system above the first threshold temperature level.

The memory access operation may be a read operation; and the method may further include determining a read voltage for the read operation based on the adjusted at least one of the clock frequency and the data I/O speed.

The determining may determine the read voltage using a valley search operation.

At least one other example embodiment provides a method for operating a NAND flash memory system, the method comprising: detecting a decrease in temperature of the NAND flash memory system below a first threshold temperature level; and adjusting, in response to detecting the decrease in the temperature below the first threshold temperature level, an operating condition for a memory access operation according to a temperature resistance characteristic of a cell transistor of the NAND flash memory system.

At least one other example embodiment provides a method for operating a NAND flash memory controller, the method comprising: detecting a decrease in temperature of a NAND flash memory system below a first threshold temperature level; and adjusting, by the NAND flash memory controller, an operating condition for a memory access operation in response to detecting the decrease in the temperature below the first threshold temperature level.

BRIEF DESCRIPTION OF THE FIGURES

Example embodiments will become more apparent from the following description with reference to the figures, wherein like reference numerals refer to like parts throughout the various figures unless otherwise specified, and wherein:

FIGS. 2 and 3 are block diagrams schematically illustrating example embodiments of the memory controller shown in FIG. 1;

FIG. 4 is a flow chart for describing example operation of example embodiments of the clock control unit shown in FIGS. 1 to 3;

DETAILED DESCRIPTION

Figure 1:
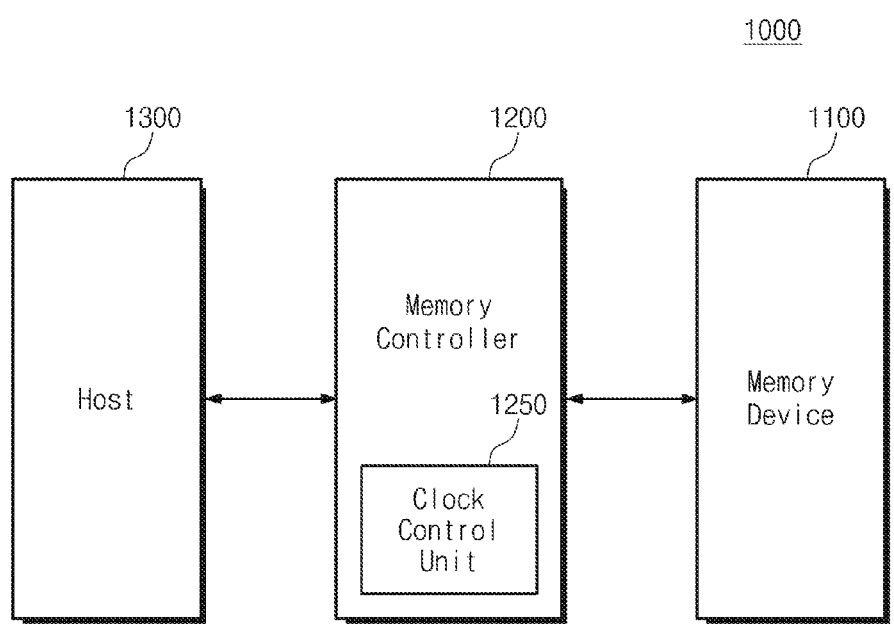
FIG. 1 is a block diagram schematically illustrating a memory system according to an example embodiment of inventive concepts.

Example embodiments will be described in detail with reference to the accompanying drawings. Inventive concepts, however, may be embodied in various different forms, and should not be construed as being limited only to the illustrated example embodiments. Rather, these embodiments are provided as examples so that this disclosure will be thorough and complete, and will fully convey inventive concepts to those skilled in the art. Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments may be described with reference to acts and symbolic representations of operations (e.g., in the form of flow charts, flow diagrams, data flow diagrams, structure diagrams, block diagrams, etc.) that may be implemented as program modules or functional processes including routines, programs, objects, components, data structures, etc., that perform particular tasks or implement particular abstract data types. The operations may be implemented using existing hardware in existing electronic systems (e.g., memory systems, System-on-Chip (SoC) devices, SoC systems, electronic devices, such as personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), SoCs, field programmable gate arrays (FPGAs), computers, or the like.

Further, one or more example embodiments of clock control units, voltage control units, drive strength control units, components thereof, or the like, may be implemented with (or include) hardware, firmware, hardware executing software, or any combination thereof. Such hardware may include one or more CPUs, SoCs, DSPs, ASICs, FPGAs, computers, or the like, configured as special purpose machines or processing circuitry to perform the functions described herein as well as any other well-known functions of these elements. In at least some cases, CPUs, SoCs, DSPs, ASICs and FPGAs may generally be referred to as processing circuitry, processors and/or microprocessors. Although components such as the clock control units, the voltage control units, the drive strength control units, etc. may be referred to as "units," these components may also be referred to as "circuits."

Although a flow chart may describe operations as a sequential process, many of the operations may be performed in parallel, concurrently and/or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, at least some portions of example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processing circuitry, processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Performance and operating error generation rates of flash memory-based storage devices may vary according to environmental conditions such as temperature, voltage, weather, pressure, etc. For example, a related art storage device may operate normally (e.g., relatively well) when used at a room temperature (e.g., about 20° C.), but may not operate normally when used in relatively cold temperatures (e.g., less than or equal to about −10° C.). Moreover, operating errors of related art storage devices may occur for various reasons. However, a main cause is changes in temperature characteristics of cell transistors used in memory devices as a result of being used in relatively cold or relatively hot temperature environments.

One or more example embodiments of inventive concepts provide storage devices, memory controllers, memory systems, and/or operating methods thereof, capable of reducing operating errors and/or changes in performance due to, for example, variations in conditions of the environment in which the device is used. As discussed herein, conditions of the environment may be referred to in some instances as environmental conditions.

FIG. 1 is a block diagram schematically illustrating a memory system 1000 according to an example embodiment of inventive concepts.

Referring to FIG. 1, the memory system 1000 includes: a memory device 1100; a memory controller 1200; and a host 1300.

The memory device 1100 may be controlled by the memory controller 1200, and may operate in response to commands (e.g., read commands, write commands, etc.) received from the memory controller 1200. The memory device 1100 may include a volatile memory, such as a dynamic random access memory (DRAM), a static RAM (SRAM), etc., and a nonvolatile memory, such as electrically erasable programmable read-only memory (EEPROM), ferroelectric RAM (FRAM), phase-change RAM (PRAM), magnetic RAM (MRAM), flash memory, etc.

According to at least some example embodiments, the nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be deposited (e.g., directly deposited) on the layers of each underlying level of the array.

In one or more example embodiments, the 3D memory array may include vertical NAND (VNAND) strings that are vertically oriented such that at least one memory cell is located over another memory cell. The at least one memory cell may comprise a charge trap layer. Each VNAND string may further include at least one select transistor located over memory cells. The at least one select transistor may have the same structure with the memory cells and may be formed monolithically together with the memory cells.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Patent Application Publication No. 2011/0233648.

Returning to FIG. 1, the memory controller 1200 is connected between the memory device 1100 and the host 1300. The memory controller 1200 may read data from the memory device 1100 in response to a read request from the host 1300. The memory controller 1200 may send the read data to the host 1300. The memory controller 1200 may also receive a write request and data from the host 1300, and may provide the write data to the memory device 1100 in response to the write request.

The host 1300 may communicate with the memory controller 1200 according to one or more data communication protocols. For example, the host 1300 may communicate with the memory controller 1200 through at least one of a variety of interface protocols, such as, a Universal Serial Bus (USB) protocol, an embedded MultiMedia Card (eMMC) protocol, a Universal Flash Storage (UFS) protocol, a Peripheral Component Interconnection (PCI) protocol, a PCI-express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, an Integrated Drive Electronics (IDE) protocol, a Firewire protocol, etc.

The memory device 1100 and the memory controller 1200 may exchange data in synchronization with transitions of a clock (also referred to as a clock signal). Data transfer (also referred to as input/output) methods between the memory device 1100 and the memory controller 1200 may include: Single Data Rate (SDR) in which data is input and output at a rising or falling transition of the clock; Dual Data Rate (DDR) in which data is input and output at rising and falling transitions of the clock; etc. The memory controller 1200 may read data from the memory device 1100 in synchronization with a transition of a read clock during a read operation, and may provide data to the memory device 1100 in synchronization with a transition of a write clock during a write operation. The read clock and the write clock may be generally referred to as operating clocks. Similarly, as discussed herein read and write voltages may be referred to as operating voltages, and read and write operations may be referred to as memory access operations.

Still referring to FIG. 1, the memory controller 1200 includes a clock control unit 1250. The clock control unit 1250 may control a data I/O speed of the memory device 1100. The data I/O speed of the memory device 1100 may be adjusted by changing a frequency of one or more operating clocks, such as the read and/or write clock. The data I/O speed increases as a clock frequency increases, and decreases as the clock frequency decreases. The clock control unit 1250 may be implemented in various ways. For example, the clock control unit 1250 may be implemented as hardware, software such as an algorithm, firmware, etc., executed on hardware, or combination of hardware and software.

FIGS. 2 and 3 are block diagrams schematically illustrating example embodiments of the memory controller 1200 illustrated in FIG. 1. FIG. 2 illustrates an example embodiment of a memory controller 1200a in which the clock control unit 1250 is implemented with hardware, whereas FIG. 3 illustrates an example embodiment of a memory controller 1200b in which the clock control unit 1250 is implemented by software modules executed with hardware.

Referring to FIG. 2, the memory controller 1200a includes: a memory interface 1210; a host interface 1220; a Central Processing Unit (CPU) 1230; a Random Access Memory (RAM) 1240; a clock control unit 1250; and a Read Only Memory (ROM) 1260.

The memory interface 1210 is coupled to the memory device 1100. In synchronization with transitions of an operating clock, the memory interface 1210 may read data from, or provide data to, the memory device 1100. The memory interface 1210 may transmit and receive data using various methods based on the type of memory device 1100. For example, when the memory device 1100 is a NAND flash memory device, the memory interface 1210 may exchange data according to a NAND flash interface methodology. The NAND flash memory may output or receive data in synchronization with transitions of a read enable signal nRE or a write enable signal nWE, respectively. The NAND flash memory may be a 2D or 3D NAND as discussed herein.

Still referring to FIG. 2, the CPU 1230 may control an overall operation of the memory controller 1200a, and perform all operations of algorithms, programs, etc. When receiving a write or read request from the host 1300, the CPU 1230 may control an overall operation of the memory controller 1200a to perform a write or read operation on the memory device 1100. The CPU 1230 may operate according to a CPU clock, and may control the RAM 1240, the clock control unit 1250, and the ROM 1260.

The RAM 1240 may operate under control of the CPU 1230. The RAM 1240 may be used as a working memory, a buffer memory, a cache memory, etc. When used as the working memory, the RAM 1240 may temporarily store data processed by the CPU 1230. When used as the buffer memory, the RAM 1240 may buffer data transferred from the host 1300 to the memory device 1100, or from the memory device 1100 to the host 1300.

When used as a cache memory, the RAM 1240 may allow a relatively low-speed memory device 1100 to operate at relatively high speeds. In this case, file data stored at the RAM 1240 may be dumped into a buffer area of the memory device 1100. The CPU 1230 may manage a mapping table according to a dump operation. The RAM 1240 may be used as a driving memory for driving a Flash Translation Layer (FTL) when the memory device 1100 is a flash memory. The FTL may be used to manage a merge operation of a flash memory, a mapping table, etc.

Still referring to FIG. 2, the clock control unit 1250, as described with reference to FIG. 1, may control a data I/O speed of the memory device 1100. The clock control unit 1250 may change a frequency of a read and/or write clock (operating clock(s)) to be provided to the memory device 1100, for example, by dividing the CPU clock of the CPU 1230. The clock control unit 1250 may receive information associated with variations in environmental conditions of the memory system 1000, and may change or adjust a frequency of an operating clock to be provided to the memory device 1100 based on the received information. The environmental conditions of the memory system 1000 may include the temperature of the memory system 1000, the ambient temperature of the memory system 1000, voltage, pressure, weather, use time, etc.

Performance and/or occurrence of operating errors at the memory system 1000 may vary according to changes in the conditions of the environment in which the memory system 1000 is used. In one example, if the memory device 1100 is a smart phone, then the performance and/or operating error generation rate of the smart phone may vary according to conditions of the environment of the smart phone; for example, when a user employs the smart phone in a tropical area (e.g., in an area with relatively hot temperatures) and when a user employs the smart phone in a polar region (e.g., in an area with relatively cold temperatures). The variation in performance and/or operating errors of the smart phone may occur for various reasons. In one example, a cause for variations in performance and/or operating error of the smart phone may be temperature characteristics of memory cell transistors used in the memory device 1100.

To reduce variations in performance and/or operating errors due to changes in environmental conditions of the memory device 1100, the clock control unit 1250 may adjust (or change) a frequency of the CPU clock, the read clock and/or write clock (operating clock(s)) to be provided to the memory device 1100. For example, the clock control unit 1250 may lower an operating clock frequency in relatively cold temperature conditions (e.g., less than or equal to about −10° C.). The clock control unit 1250 may also set the operating clock frequency to a relatively high (e.g., a maximum) value at warmer temperatures including room temperature (e.g., at about 20° C. or between about −10° C. and about 85° C.), and decrease the operating clock frequency at relatively hot temperatures (e.g., greater than or equal to about 85° C.). By adjusting the operating clock frequency in this manner, the performance of the memory system 1000 may be improved and/or maximized, while reducing and/or minimizing operating errors thereof.

Referring to FIG. 3, in the memory controller 1200b the clock control unit 1250 may be implemented by processing circuitry executing one or more algorithms and/or firmware, and may be driven on the RAM 1240. At power-off, the clock control unit 1250 may be stored on a nonvolatile memory, such as the memory device 1100 or the ROM 1260, in the form of firmware. At power-on, the clock control unit 1250 may be loaded into the RAM 1240 during an initialization operation.

When environmental conditions of the memory system 1000 change, the clock control unit 1250 may adjust the data I/O speed of the memory device 1100 in the same or substantially the same manner as described above with regard to FIG. 2, thereby improving and/or maximizing the performance of the memory system 1000, while reducing and/or minimizing operating errors of the memory system 1000. Methods for adjusting data I/O speed for memory access operations will be described in more detail later.

FIG. 4 is a flow chart for describing example operation of an example embodiment of the clock control unit 1250. For example purposes, the example embodiment shown in FIG. 4 will be discussed with regard to the clock control unit 1250. The clock control unit 1250 may improve and/or maximize performance by setting a data I/O speed for one or more memory access operations to a normal (e.g., a maximum) speed during a normal operation, but reducing the data I/O speed in response to detecting an operating error of the memory system 1000. Below, an example embodiment of an operating method of the clock control unit 1250 will be described in more detail.

Referring to FIG. 4, at S110 the clock control unit 1250 sets the data I/O speed to a normal speed for memory access operations during normal operation. In one example, the clock control unit 1250 may set a clock frequency for data input/output to a maximum value during the normal operation, thereby maximizing the performance of the memory device 1100. For a DDR memory, the normal data I/O speed may be about 400 Mbps, which corresponds to a clock frequency of about 200 MHz.

At S120, the clock control unit 1250 determines whether an error occurs in input/output data during a first iteration of a memory access operation, such as a read and/or write operation.

According to at least one example embodiment, clock control unit 1250 (or the storage controller 1200) determines whether an error occurs in the input/output data by comparing a written error correction code (ECC) for the input/output data with an expected ECC. If the ECC for the input/output data is different from the expected ECC, then the clock control unit 1250 determines that an error occurs in the input/output data during the first iteration of the memory access operation.

If, at S120, an error does not occur in the input/output data (No), then the process returns to S110 and normal operation continues.

Returning to S120, if the clock control unit 1250 determines that an error occurs in the input/output data (Yes), then at S1300 the clock control unit 1250 performs a retry operation (hereinafter referred to as "retry process") for restoring an error.

As discussed in more detail below, the retry process may include a plurality of operations. In the example embodiment shown in FIG. 4, the retry process includes two operations. However, example embodiments should not be limited to this example.

Still referring to FIG. 4, during the retry process S1300, at S130 the clock control unit 1250 adjusts one or more operating conditions (e.g., a data I/O speed, a level of an operating voltage, a drive strength, etc.) of the memory device 1100. After adjusting the one or more operating conditions, the memory device 1100 performs a second iteration of the memory access operation using the adjusted one or more operating conditions. Although referred to herein as a clock control unit, this unit may also be referred to as a control unit (or circuit), which may adjust operating conditions, such as operating voltage and drive strength in addition to clock frequency and data I/O speed. In this regard, the clock control unit may also include a voltage control unit and/or a drive strength control unit, which are described in more detail later.

In more detail with regard to S130 in FIG. 4, if the operating condition is a data I/O speed, then the clock control unit 1250 may adjust and/or set the data I/O speed for a second iteration of the data input/output operation to a first data I/O speed. In one example, the first data I/O speed may be a normal speed to improve and/or maximize performance of the memory system 1000. In another example, the clock control unit 1250 may decrease the data I/O speed from the normal speed to a first decreased data I/O speed, which is less than the normal speed, to improve data reliability. In still another example, the clock control unit 1250 may increase a data I/O speed (and/or clock frequency) to a maximum value to perform the second iteration more quickly. In this case, the clock control unit 1250 may increase the operating voltage and/or drive strength for the memory access operation to improve data reliability at the higher speeds.

In another example, the clock control unit 1250 may increase the operating voltage (e.g., read and/or write voltage) level for the second iteration of the memory access operation to a first increased operating voltage level, which is greater than the operating voltage level used during the first iteration of the memory access operation.

In yet another example, the clock control unit 1250 may increase the drive strength for the second iteration of the memory access operation to a first increased drive strength, which is greater than the drive strength used during the first iteration of the memory access operation.

Returning to FIG. 4, the clock control unit 1250 may then perform the second iteration of the memory access operation using the adjusted one or more operating conditions, and determine whether an error occurs during the second iteration of the memory access operation at S140. The clock control unit 1250 may determine whether an error occurs during the second iteration of the memory access operation S140 in the same or substantially the same manner as discussed above with regard to S120.

If an error does not occur (No), then the clock control unit 1250 may store the adjusted one or more adjusted operating conditions in the RAM 1240, and return to S110 at which the stored one or more operating conditions are utilized as operating conditions for normal operation of the memory device 1100 going forward.

Returning to S140, if an error occurs during the second iteration of the memory access operation, then the clock control unit 1250 further adjusts the one or more operating conditions for a third iteration of the memory access operation.

In one example, the clock control unit 1250 may decrease the data I/O speed for the memory access operation to a second decreased data I/O speed, which is less than the first decreased data I/O speed, to improve data reliability. In another example, the clock control unit 1250 may decrease the data I/O speed for the memory access operation from the normal speed to the first decreased data I/O speed to improve data reliability. In still another example, the clock control unit 1250 may increase a data I/O speed (and clock frequency) to, for example, a maximum value to perform the third iteration of the memory access operation more quickly. In this example, other operating conditions may also be adjusted to improve data reliability at higher speeds.

In another example, the clock control unit 1250 may further increase the operating voltage level for the third iteration of the memory access operation to a second increased operating voltage level, which is greater than the first increased operating voltage level used during the second iteration of the memory access operation.

In yet another example, the clock control unit 1250 may further increase the drive strength for the third iteration of the memory access operation to a second increased drive strength, which is greater than the first increased drive strength used during the second iteration of the memory access operation.

In step S160, the clock control unit 1250 performs the third iteration of the memory access operation (second retry operation) using the further adjusted one or more operating conditions.

If an error occurs during the third iteration of the memory access operation, then the memory system 1000 may output an error. If, however, an error does not occur, then the clock control unit 1250 may store the adjusted one or more operating conditions (e.g., operating voltage level, data I/O speed, drive strength, etc.) in the RAM 1240, and utilize the stored one or more operating conditions as operating conditions for normal operation of the memory device 1100 going forward.

To reduce and/or minimize operating errors of the memory system 1000 and/or to improve data reliability, the third iteration of the memory access operation may be performed using one or more operating conditions suitable for improving data reliability and reducing errors (e.g., the second decreased data I/O speed, the second increased operating voltage level, the second increased drive strength, etc.). The clock control unit 1250 may restore erroneous input/output data by managing operating conditions for memory access operations (e.g., data input/output operations) of the memory device 1100 as discussed herein.

According to at least some example embodiments, the clock control unit 1250 may adjust operating conditions for memory access operations to facilitate error recovery. After error recovery is complete, the clock control unit 1250 may adjust the operating conditions for the memory access operations back to normal (e.g., initial and/or maximum). In one example, the clock control unit 1250 may reduce data I/O speed for a memory access operation to facilitate error recovery. In this example, after error recovery is complete, the clock control unit 1250 may increase the data I/O speed for the memory access operation back to the normal speed.

In another example, the clock control unit 1250 may adjust operating conditions for memory access operations to facilitate error recovery for a given (or alternative, desired or predetermined) time period. After error recovery, or expiration of the time period, the clock control unit 1250 may adjust the operating conditions for the memory access operations back to normal. For example, the clock control unit 1250 may reduce data I/O speed for a memory access operation to facilitate error recovery for a given (or alternative, desired or predetermined) time period. After error recovery, or expiration of the time period, the clock control unit 1250 may increase the data I/O speed back to the normal speed.

As described above, the memory system 1000 according to at least one example embodiment of inventive concepts may include the clock control unit 1250 implemented in the memory controller 1200. As discussed above, the clock control unit 1250 may adjust a data I/O speed (as well as operating voltage and/or drive strength) for memory access operations and/or iterations of memory access operations.

According to one or more example embodiments of inventive concepts, the performance of the memory system 1000 may be improved and/or maximized, while reducing and/or minimizing operating errors thereof, by lowering a clock frequency in an environment with relatively cold temperatures (e.g., less than or equal to about −10° C.) and in an environment with relatively hot temperatures (e.g., greater than or equal to about 85° C.), and setting the clock frequency to a relatively high level at warmer temperatures such as room temperature (e.g., about 20° C. or between about −10° C. and about 85° C.).

According to at least some example embodiments, the memory device 1100 shown in FIG. 1 may be a flash memory. Since flash memory is able to store relatively large amounts of data in a relatively short period of time, flash memory is widely used as a data storage device. A flash memory-based storage device may be used as a removable storage medium, such as an SD card, a micro SD card, a USB storage device, etc., or as an embedded storage medium, such as an eMMC, etc. In particular, for example, a flash memory-based storage device may be widely used for mobile devices, such as smart phones, a tablet PCs, etc. When this type of storage device is applied to a mobile device, operation of the storage device may be influenced by surrounding environments, such as temperature, pressure, etc., according to a user's location. By utilizing example embodiments, performance of memory systems may be improved and/or optimized, while reducing and/or minimizing operating errors.

According to one or more example embodiments, a flash memory system may include a temperature sensor and a control circuit (or unit). The temperature sensor may detect a decrease in temperature of a flash memory system, such as a NAND flash memory system, below a first threshold temperature level, and the control circuit may adjust an operating condition for a memory access operation in response to the detected decrease in the temperature below the first threshold temperature level.

The operating condition may include one or more of (i) a data I/O speed for a memory access operation, (ii) a read voltage level for the memory access operation, and (iii) a drive strength for the flash memory system.

In one example, the control circuit may be a clock control unit, and the operating condition may be a data I/O speed for a memory access operation. In this example, the clock control unit may decrease the data I/O speed for the memory access operation from a first data I/O speed (e.g., a maximum speed) to a second data I/O speed in response to detecting the decrease in the temperature of the flash memory system below the first threshold temperature level.

If the temperature sensor detects a further decrease in the temperature of the flash memory system below a second threshold temperature level, the clock control unit may further decrease the data I/O speed from the second data I/O speed to a third data I/O speed in response to detecting the further decrease in the temperature of the flash memory system below the second threshold temperature level.

If the temperature sensor detects an increase in the temperature of the flash memory system back above the first threshold temperature level, then the clock control unit may increase the data I/O speed from the second data I/O speed back to the first data I/O speed in response to detecting the increase in the temperature of the flash memory system above the first threshold temperature level.

If the operating condition is a drive strength or a read voltage level for the memory access operation, then the control circuit may increase the drive strength or read voltage level from a first level to a second level in response to detecting the decrease in the temperature of the flash memory system below the first threshold temperature level. In this case, the control circuit may be (or include) a clock control unit, a drive strength control unit and/or a voltage control unit.

The control circuit may further increase the drive strength or the read voltage level from the second level to a third level in response to detecting a further decrease in the temperature of the flash memory system below the second threshold temperature level by the temperature sensor.

If the temperature sensor detects an increase in the temperature of the flash memory system back above the first threshold temperature level, then the control circuit may decrease the drive strength or the read voltage level from the second level back to the first level in response to detecting the increase in the temperature of the flash memory system above the first threshold temperature level.

Although discussed separately, the control circuit may adjust one or more of the operating conditions in response to detected temperature changes.

According to at least some example embodiments, the control circuit may adjust a data I/O speed for a memory access operation based on temperature information associated with a memory system. For example, the control circuit may adjust the data I/O speed to a first data I/O speed if the temperature information indicates that a temperature of the memory system is below a first threshold temperature level; the control circuit may adjust the data I/O speed to a second data I/O speed if the temperature information indicates that the temperature of the memory system is between the first threshold temperature level and a second threshold temperature level; the control circuit may adjust the data I/O speed to a third data I/O speed if the temperature information indicates that the temperature of the memory system is greater than the second threshold temperature level. The first data I/O speed and the third data I/O speed may be less than the second data I/O speed.

According to at least some example embodiments, a NAND flash memory system includes a temperature sensor and a clock control circuit. The temperature sensor may detect a decrease in temperature of the NAND flash memory system below a first threshold temperature level, and the clock control circuit may decrease at least one of a clock frequency and a data I/O speed for a memory access operation in response to the detected decrease in the temperature below the first threshold temperature level.

Figure 5:
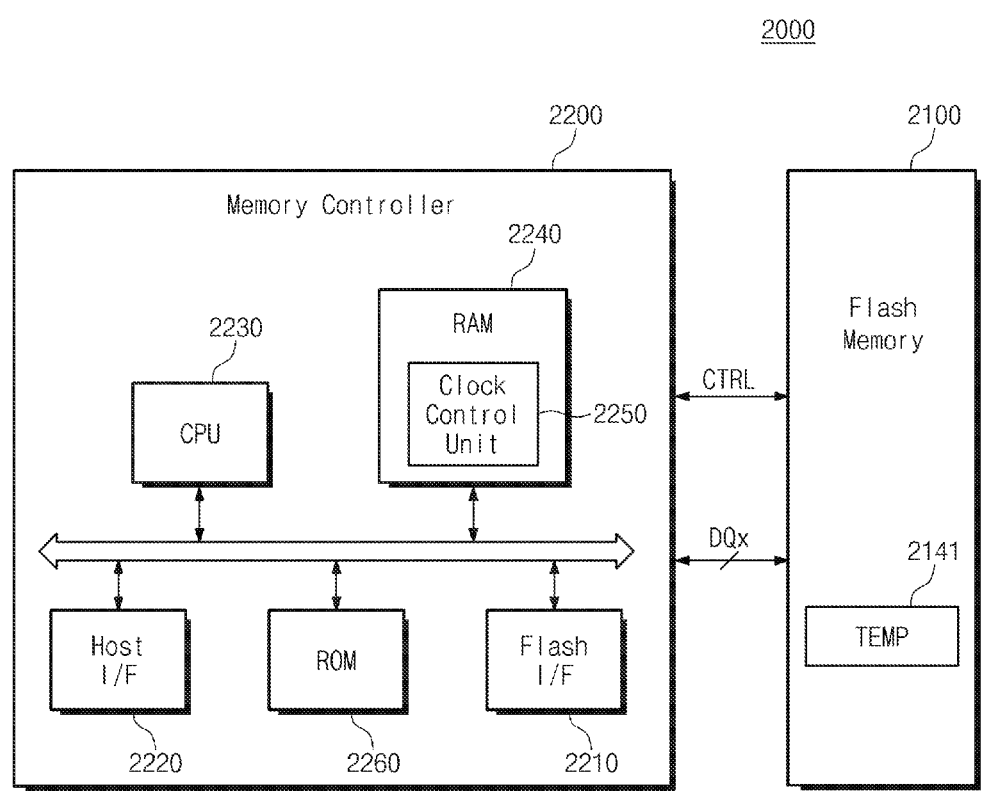
FIG. 5 is a block diagram schematically illustrating a flash memory-based storage device, according to an example embodiment of inventive concepts.

FIG. 5 is a block diagram schematically illustrating a flash memory-based storage device 2000 according to an example embodiment of inventive concepts.

Referring to FIG. 5, the storage device 2000 includes a flash memory 2100 and a memory controller 2200.

The flash memory 2100 may perform the following memory access operations according to a control of the memory controller 2200: an erase operation, a write operation, a read operation, etc. The flash memory 2100 may perform erase operations in units of memory blocks, while the write and/or read operations may be performed in units of pages. The flash memory 2100 may have a 2D structure or a 3D structure according to a structure of a cell array. Memory cells of a planar type flash memory having the 2D structure may be formed in a direction parallel or substantially parallel with a substrate. Memory cells of a vertical NAND (VNAND) type flash memory having the 3D structure may be formed in a direction perpendicular or substantially perpendicular to the substrate.

In at least one example embodiment, the flash memory 2100 may be embodied to include a 3D memory array. The 3D memory array may be monolithically formed on a substrate (e.g., semiconductor substrate such as silicon or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be deposited (e.g., directly deposited) on the layers of each underlying level of the array.

In one or more example embodiments, the 3D memory array may include VNAND strings that are oriented vertically such that at least one memory cell is located over another memory cell. The at least one memory cell may include a charge trap layer. Each VNAND string may further include at least one select transistor located over the memory cells. The at least one select transistor may have the same or substantially the same structure as the memory cells, and may be formed monolithically together with the memory cells.

Returning to FIG. 5, the flash memory 2100 may store single bit data or multi-bit data (e.g., two or more data bits) per memory cell. An SLC flash memory that stores single bit data per memory cell may have an erase state and a program state according to threshold voltage distributions. An MLC flash memory that stores multi-bit data per memory cell may have an erase state and a plurality of program states according to threshold voltage distributions.

The memory controller 2200 may control memory access operations (e.g., a read operation, a write operation, etc.) of the flash memory 2100 in response to a request from an external device (e.g., a host).

As shown in FIG. 5, the memory controller 2200 includes: a flash interface 2210; a host interface 2220; a Central Processing Unit (CPU) 2230; a RAM 2240; a clock control unit 2250; and a ROM 2260.

The clock control unit 2250 may be implemented in the same or substantially the same manner as discussed above with regard to the clock control unit 1250 (e.g., by hardware, software driven on the RAM 2240 and executed by hardware, and/or a combination of hardware and software). If implemented in software driven on the RAM 2240, the clock control unit 2250 may be stored at the flash memory 2100 at power-off, and loaded into the RAM 2240 at power-on during an initialization operation.

As illustrated in FIG. 5, the flash memory 2100 includes a temperature sensing device ("TEMP") 2141. The temperature sensing device 2141 may also be referred to as a temperature sensor.

The temperature sensing device 2141 may sense (or detect) a temperature of the flash memory 2100, and output temperature information indicative of the detected temperature to the memory controller 2200. In one example, if the temperature sensing device 2141 detects an increase in the temperature of the flash memory above a threshold value, and the flash memory 2100 begins to operate abnormally (e.g., errors occur due to the temperature variation), then the clock control unit 2250 may adjust (e.g., decrease) a data I/O speed for the flash memory 2100 according to control of the CPU 2230. According to at least one example embodiment, the clock control unit 2250 may change the data I/O speed based on the temperature information from the flash memory 2100.

According to at least some example embodiments, the temperature sensing device 2141 may be, for example, a digital thermometer or any other suitable thermometer or temperature sensing device. The temperature sensing device 2141 may sense (detect) a value of the temperature of the flash memory 2100 periodically, and store the periodically sensed temperature in, for example, the flash memory 2100. According to at least some other example embodiments, the temperature sensing device 2141 may sense the temperature of the flash memory 2100 on-demand in response to, for example, a read request.

In at least one example embodiment, the clock control unit 2250 may adjust the data I/O speed for the flash memory 2100 in a step-wise manner as the temperature of the flash memory 2100 varies.

Figure 25:
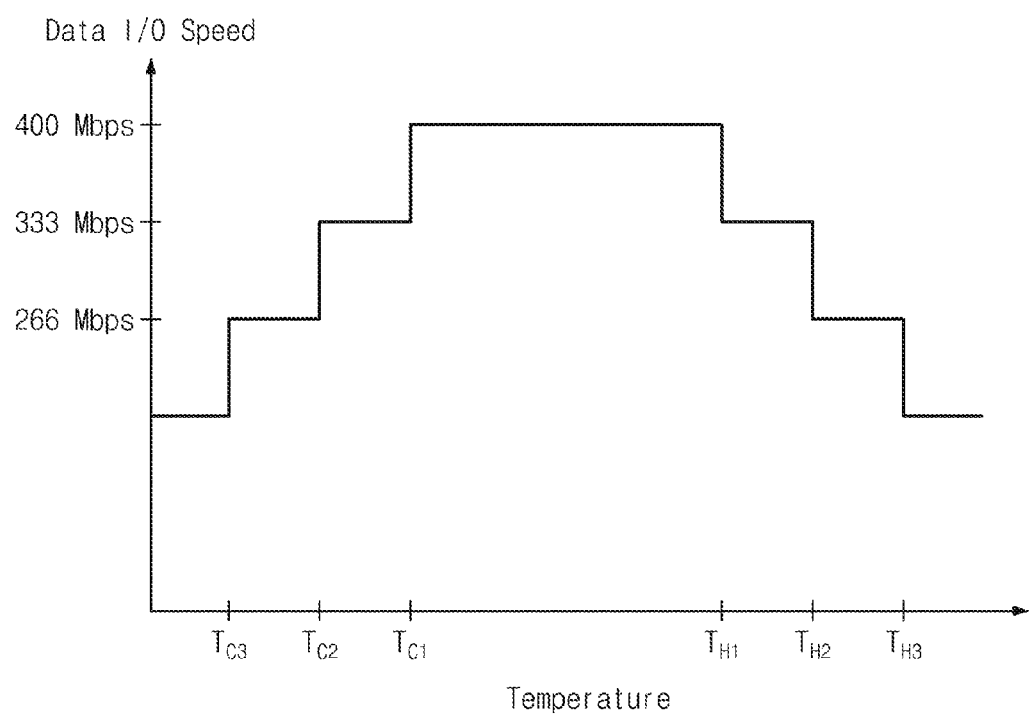
FIG. 25 is a graph of data I/O speed versus temperature for describing example operation of a clock control unit according to an example embodiment of inventive concepts.
Figure 26:
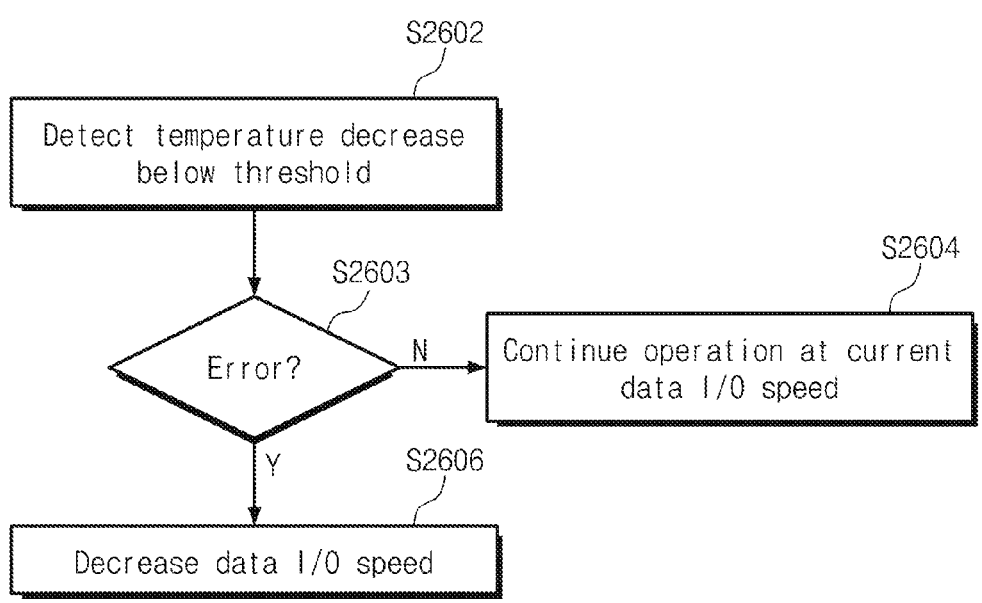
FIG. 26 is a flow chart illustrating an example embodiment of a method for controlling data I/O speed for memory access operations performed on a storage device according to an example embodiment of inventive concepts.

FIG. 25 is a graph of data I/O speed versus temperature for illustrating example operation of the storage device 2000 shown in FIG. 5. FIG. 26 is a flow chart illustrating an example embodiment of a method for controlling the data I/O speed for memory access operations performed at the storage device 2000. Although not shown in FIG. 26, the method may be performed iteratively as the temperature of the storage device 2000 decreases.

The graph shown in FIG. 25 illustrates an example in which the clock control unit 2250 decreases the data I/O speed for memory access operations on the flash memory 2100 in a step-wise manner as the temperature of the flash memory 2100 decreases. The graph shown in FIG. 25 also illustrates that, in at least some situations, the clock control unit 2250 increases the data I/O speed for the flash memory 2100 in a step-wise manner as the temperature of the flash memory 2100 increases.

Referring to FIGS. 25 and 26, at S2602 the temperature sensing device 2141 detects a decrease in temperature of the storage device 2000 below a threshold temperature value (e.g., $T_{C1}$, $T_{C2}$, $T_{C3}$). In response to detecting the decrease in temperature, the temperature sensing device 2141 outputs temperature information to the clock control unit 2250. The temperature information indicates that the temperature of the storage device 2000 has fallen below the threshold temperature value.

In response to receiving the temperature information, at S2603 the clock control unit 2250 determines whether an error has occurred during a current memory access operation. The clock control unit 2250 may determine whether an error has occurred during the current memory access operation in the same or substantially the same manner as discussed above with regard to S120 in FIG. 4.

If an error has not occurred, then the clock control unit 2250 does not adjust the data I/O speed for subsequent iterations of the memory access operation, and the storage device 2000 continues to perform iterations of memory access operations at the current data I/O speed at S2604.

Returning to S2603, if an error has occurred during the memory access operation, then the clock control unit 2250 decreases the data I/O speed for subsequent iterations of the memory access operation at S2606. The storage device 2000 then performs further iterations of the memory access operation using the decreased data I/O speed.

In more detail with regard to FIG. 25, if the temperature of the flash memory 2100 is between a first lower threshold temperature $T_{C1}$ and first upper threshold temperature $T_{H1}$ (e.g., between about −10° C. and about 85° C.), then the clock control unit 2250 maintains the data I/O speed for the flash memory 2100 at a first (e.g., normal) data I/O speed of about 400 Mbps.

If the temperature sensing device 2141 detects that the temperature of the flash memory 2100 falls below the first lower threshold temperature $T_{C1}$, then the temperature sensing device 2141 outputs temperature information indicative of this temperature change to the clock control unit 2250. In response to the received temperature information, the clock control unit 2250 may decrease the data I/O speed from the first data I/O speed to a first decreased data I/O speed of about 333 Mbps for subsequent iterations of a memory access operation if an error occurs during a memory access operation.

As mentioned above, the method shown in FIG. 26 may be performed iteratively as the temperature sensing device detects further decreases in temperature.

For example, as the temperature sensing device 2141 detects further decreases in temperature (e.g., below a second lower threshold temperature $T_{C2}$, a third lower threshold temperature $T_{C3}$, etc.), the clock control unit 2250 may continue to decrease the data I/O speed in a step-wise manner.

As the temperature of the flash memory 2100 increases above the third lower threshold temperature $T_{C3}$, the second lower threshold temperature $T_{C2}$, and then the first lower threshold temperature $T_{C1}$, the clock control unit 2250 may increase the data I/O speed in a step-wise manner back to the first data I/O speed of about 400 Mbps.

Still referring to FIG. 25, the clock control unit 2250 may decrease the data I/O speed in the same or substantially the same manner as discussed above if temperature increases above the upper threshold temperatures $T_{H1}$, $T_{H2}$, and $T_{H3}$.

According to at least some example embodiments, the memory controller 2200 may include a temperature sensing device. In this case, the clock control unit 2250 may adjust (or, alternatively, modulate) the data I/O speed based on temperature information measured at the memory controller 2200.

The flash memory 2100 may be in the form of a VNAND having a 3D structure with relatively high integration and/or capacity. Moreover, the flash memory 2100 may be applied to products for sending data in a double data rate (DDR) manner for relatively high-speed operation. An operating error of the storage device 2000 due to a variation in a surrounding environment such as temperature, pressure, etc. may gradually increase with higher integration, higher capacity, and/or higher-speed operation.

Figure 6:
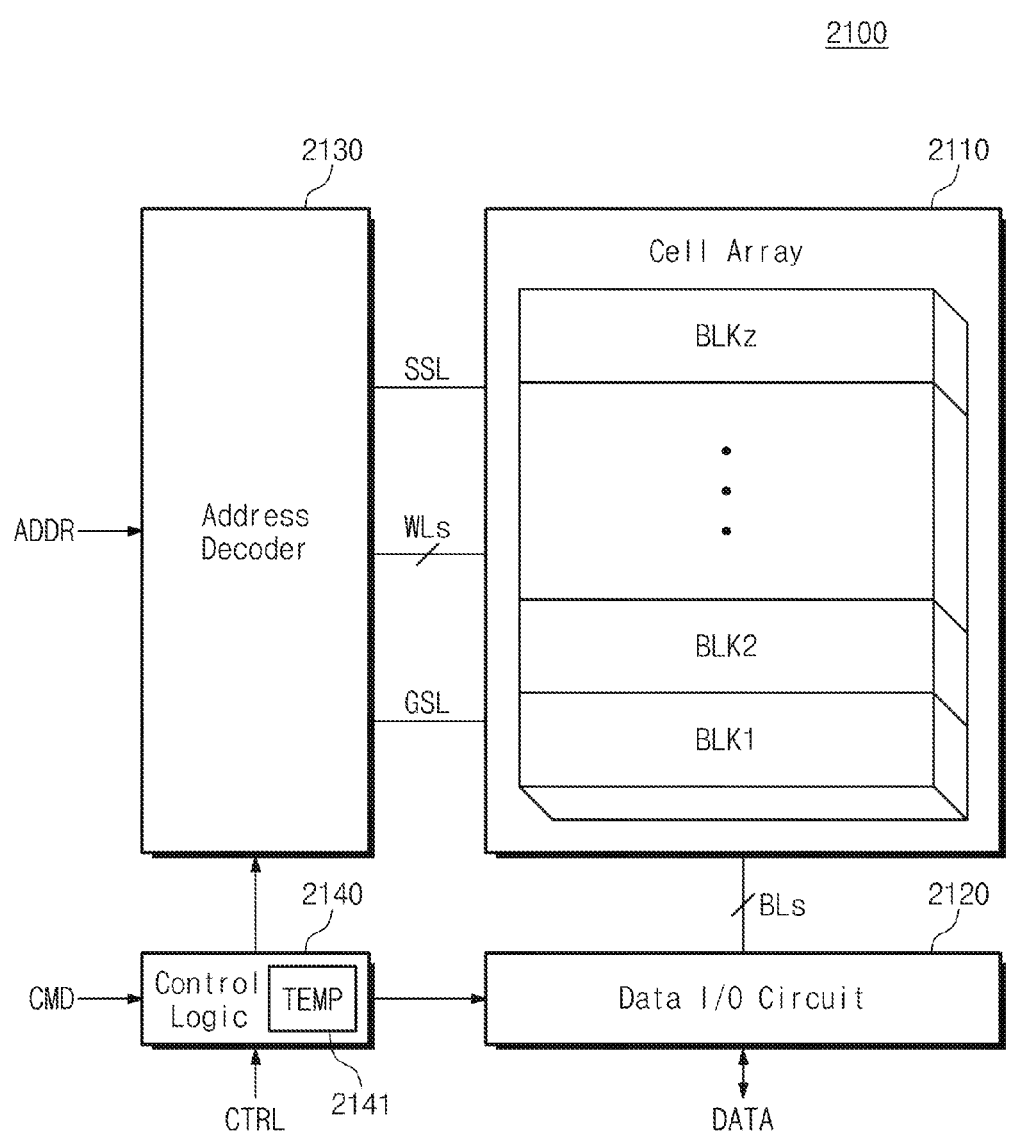
FIG. 6 is a block diagram schematically illustrating an example embodiment in which the flash memory of FIG. 5 has a three-dimensional structure.

FIG. 6 is a block diagram schematically illustrating an example embodiment in which the flash memory of FIG. 5 has a 3D structure.

Referring to FIG. 6, the flash memory 2100 includes: a cell array 2110; a data input/output circuit 2120; an address decoder 2130; and control logic 2140.

The cell array 2110 includes a plurality of memory blocks BLK1 to BLKz, each of which is formed to have a 3D structure (or a vertical structure). In a memory block having a 2D (or horizontal) structure, memory cells may be formed in a direction parallel or substantially parallel with a substrate. In a memory block having a three-dimensional structure, memory cells may be formed in a direction perpendicular or substantially perpendicular to the substrate. Each memory block may be an erase unit of the flash memory 2100.

The data input/output circuit 2120 may be connected with the cell array 2110 through a plurality of bit lines. The data input/output circuit 2120 may receive data from an external device, or may output data read from the cell array 2110 to the external device. The address decoder 2130 is connected with the cell array 2110 through a plurality of word lines and selection lines GSL and SSL. The address decoder 2130 may select the word lines in response to an address ADDR.

The control logic 2140 may control programming, erasing, reading, etc., of the flash memory 2100. For example, during programming, the control logic 2140 may control the address decoder 2130 such that a program voltage is supplied to a selected word line, and may control the data input/output circuit 2120, to program data.

In this example embodiment, the control logic 2140 includes the temperature sensing device ("TEMP") 2141. The temperature sensing device 2141 may measure a peripheral temperature (e.g., a temperature of the flash memory 2100 and/or an ambient temperature associated with the flash memory 2100, and output information indicative of the sensed temperature to the memory controller 2200. In one example, as discussed above with regard to FIGS. 25 and 26, the temperature sensing device 2141 may detect a decrease in temperature below a lower threshold value and/or above an upper threshold value, and may output temperature information indicative of the detection to the memory controller 2200.

Figure 7:
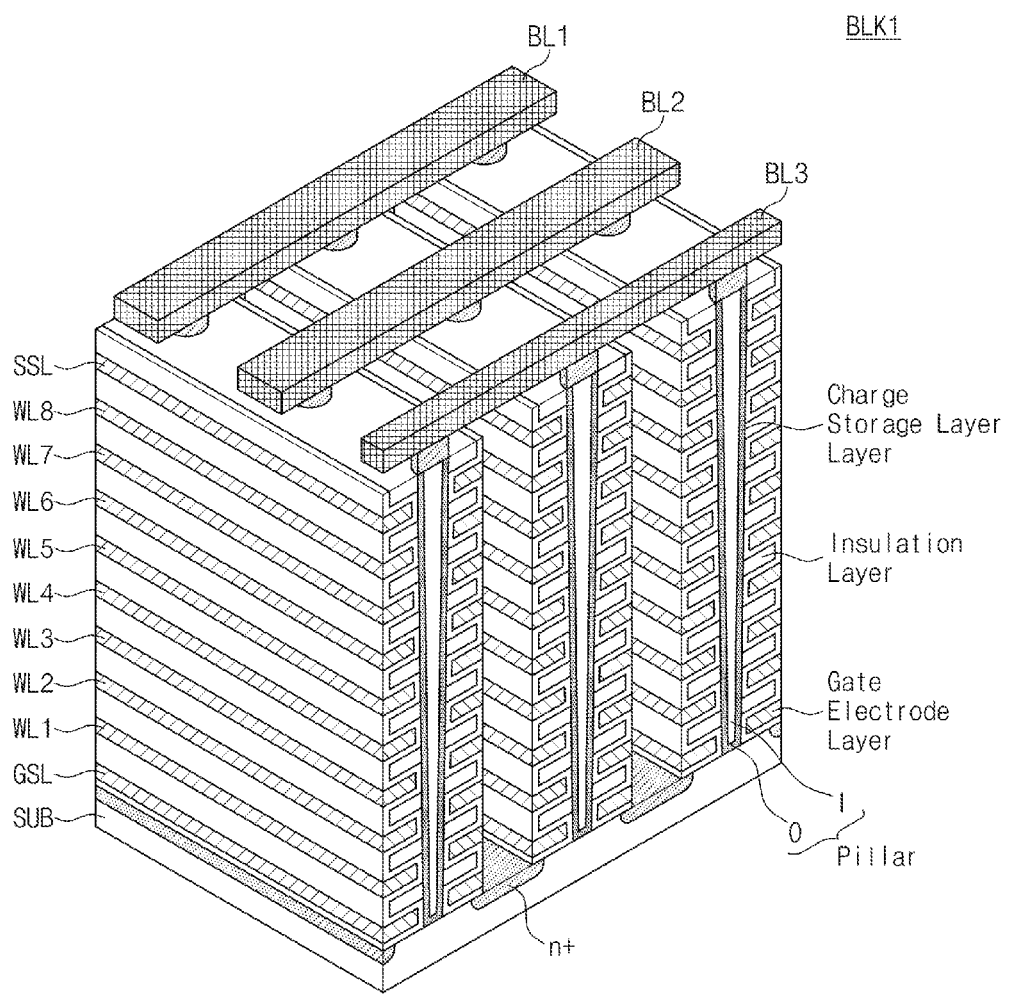
FIG. 7 is a perspective view schematically illustrating an example embodiment of a three-dimensional structure of the memory block illustrated in FIG. 6.

FIG. 7 is a perspective view schematically illustrating an example embodiment of a 3D structure of the memory block BLK1 illustrated in FIG. 6.

Referring to FIG. 7, a memory block BLK1 may be formed in a direction perpendicular to a substrate SUB. An n+ doping region may be formed at the substrate SUB. A gate electrode layer and an insulation layer may be deposited on the substrate SUB in turn. A charge storage layer may be formed between the gate electrode layer and the insulation layer.

A V-shaped pillar may be formed if the gate electrode layer and the insulation layer are patterned in a vertical direction. The pillar may be connected with the substrate SUB through the gate electrode layer and the insulation layer. An outer portion O of the pillar may be formed of a channel semiconductor, and an inner portion I thereof may be formed of an insulation material such as silicon oxide.

The gate electrode layer of the memory block BLK1 may be connected with a ground selection line GSL, a plurality of word lines WL1 to WL8, and a string selection line SSL. The pillar of the memory block BLK1 may be connected with a plurality of bit lines BL1 to BL3. In FIG. 7, an example embodiment is exemplified as one memory block BLK1 has two selection lines SSL and GSL, eight word lines WL1 to WL8, and three bit lines BL1 to BL3. However, inventive concepts should not be limited to this example. For example, the number of above-described lines may increase or decrease. Moreover, the memory block BLK1 may include one or more dummy word lines (not shown) between two selection lines SSL and GSL and a word line WL.

Figure 8:
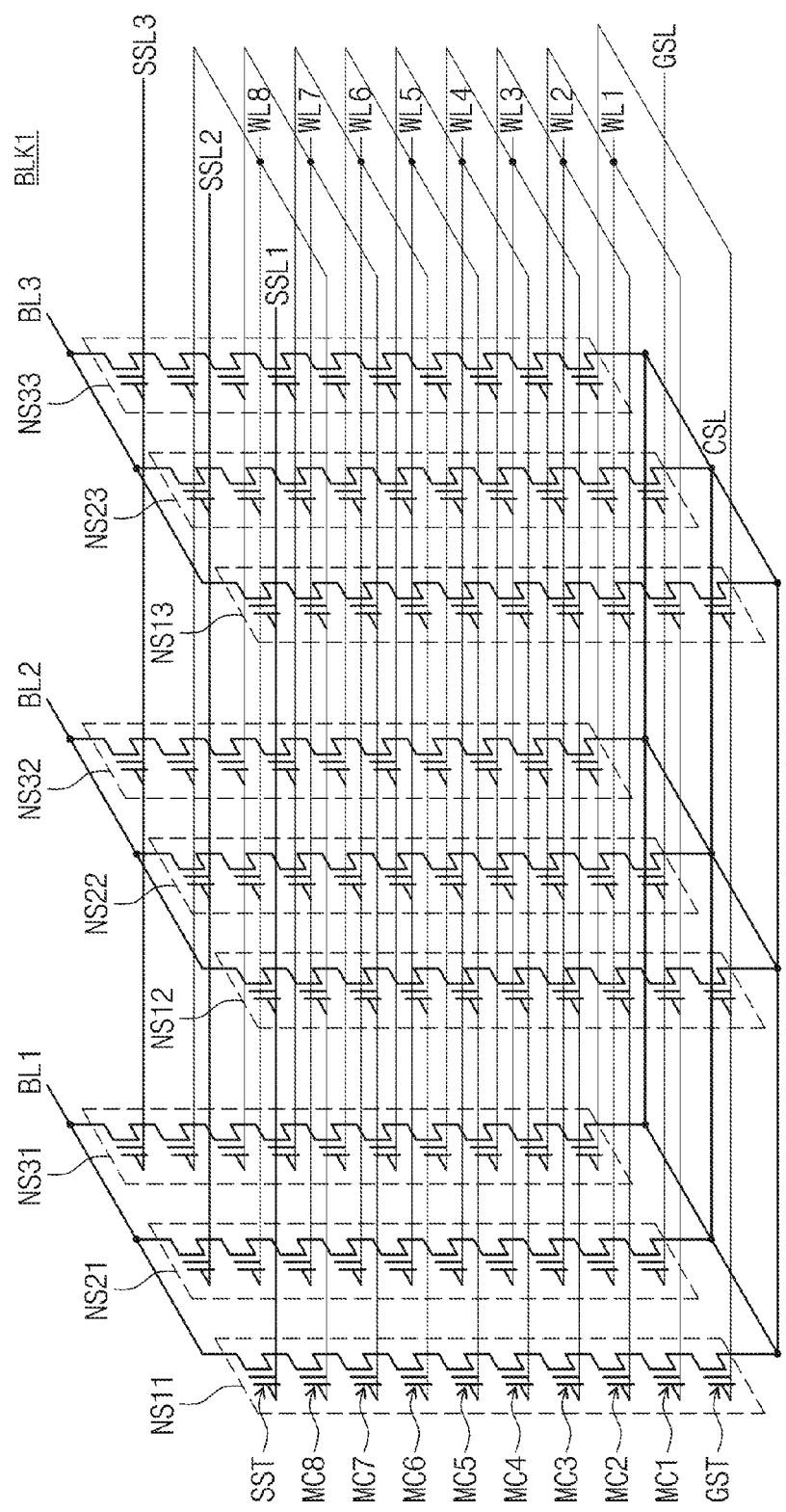
FIG. 8 is an equivalent circuit of the example embodiment of the memory block illustrated in FIG. 6.

FIG. 8 is an equivalent circuit of the memory block illustrated in FIG. 6.

Referring to FIG. 8, NAND strings NS11 to NS33 are connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected with string selection lines SSL1 to SSL3. The memory cells MC1 to MC8 are connected to respective word lines WL1 to WL8. The ground selection transistors GST are connected to a ground selection line GSL. A string selection transistor SST is connected to a bit line, and a ground selection transistor GST is connected to a common source line CSL.

Word lines (e.g., WL1) having the same or substantially the same height are connected in common, and the string selection lines SSL1 to SSL3 are separated from each other. Upon programming memory cells (constituting a page) connected with a first word line WL1 and included in NAND strings NS11, NS12, and NS13, a first word line WL1 and a first string selection line SSL1 may be selected.

Figures 9, 10:
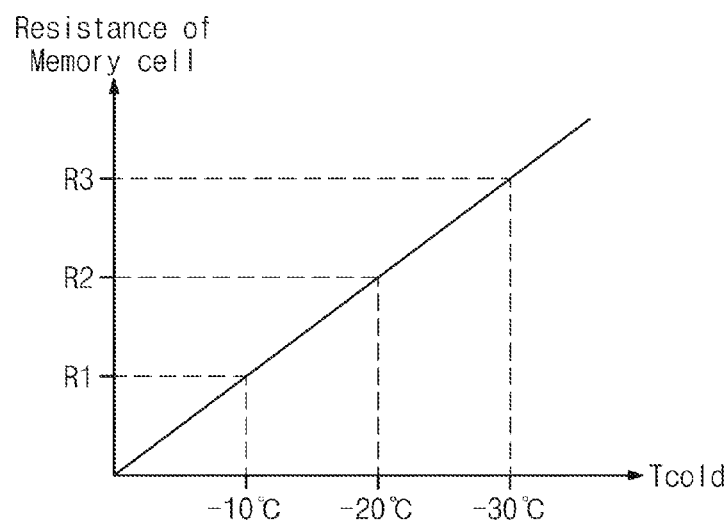
FIG. 9 is a graph illustrating example resistance variation in the memory cell shown in FIGS. 7 and 8.
FIG. 10 is a table illustrating example data error relief rate according to variations in data I/O speed and data error rate according to a temperature variation.

FIG. 9 is a graph illustrating example resistance variation of a memory cell shown in FIGS. 7 and 8. In FIG. 9, the abscissa represents a temperature variation, and the ordinate represents a resistance variation of a memory cell.

Referring to FIG. 9, resistance of a memory cell increases in inverse proportion to temperature. For example, a resistance value may be "R1" when a temperature is about −10° C., the resistance value may be "R2" when the temperature is about −20° C., and the resistance value may be "R3" when the temperature is about −30° C. In this example, R3>R2>R1.

A memory cell may have a characteristic in which the resistance increases as a temperature decreases. A data error may occur when resistance of a memory cell increases at relatively low (cold) temperatures. In particular, for example, when the storage device 2000 illustrated in FIG. 5 is a high-speed DDR memory, a data error phenomenon may increase at relatively low (cold) temperatures.

FIG. 10 is a table schematically illustrating an example data error relief rate according to a variation in a data I/O speed and a data error rate according to a temperature variation. FIG. 10 illustrates a result of testing a plurality of storage devices where data errors occur at a relatively low (cold) temperature of about −25° C.

Referring to FIG. 10, when the power supply voltage VDD of a storage device is about 1.7V and a temperature thereof is room temperature (e.g., about 20° C.), a data error may not occur when a data I/O speed is AAA Mbps, BBB Mbps, or CCC Mbps. As discussed herein, AAA may be about 400 Mbps, BBB may be about 333 Mbps, and CCC may be about 266 Mbps, such that AAA>BBB>CCC. These test results illustrate that storage devices operate normally at room temperature.

Still referring to FIG. 10, when the temperature of the storage device falls below about −25° C., a data error generation rate may vary according to a data I/O speed. For example, at −25° C. the data error generation rate is 100% when the data I/O speed is about AAA Mbps (e.g., an operating error occurs at all storage devices). When the data I/O speed is lowered to BBB Mbps, the data error generation rate is reduced to about 64%. In this case, the operating error is reduced by about 36% if the data I/O speed is lowered from AAA Mbps to BBB Mbps.

When a data I/O speed is lowered to CCC Mbps, the data error generation rate is further reduced to about 36%. Accordingly, when the data I/O speed is lowered from AAA Mbps to CCC Mbps, the data error generation rate may be reduced by about 64%. As can be understood from FIG. 10, at relatively low (cold) temperatures, a data error frequency may be decreased by lowering a data I/O speed for memory access operations performed at relatively low temperatures.

Figure 11:
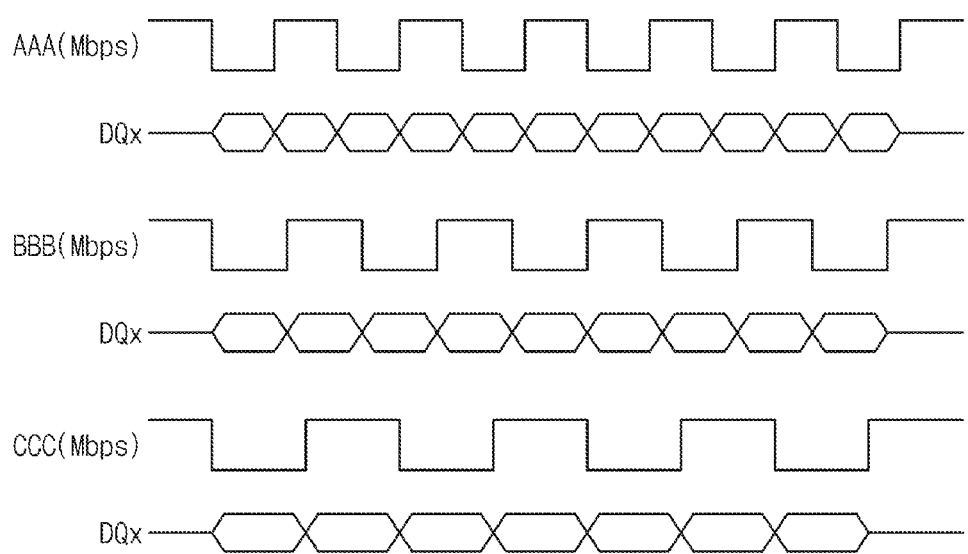
FIG. 11 is a timing diagram illustrating an example embodiment in which a data I/O speed is decreased gradually.

FIG. 11 is a timing diagram schematically illustrating an example embodiment in which a data I/O speed is gradually lowered incrementally in a step-wise manner. The clock control unit 2250 shown in FIG. 5 may adjust a clock frequency of the clock signal DQx or a data I/O speed step-by-step according to variations in a surrounding environment of the storage device 2000 as sensed, for example, by a temperature sensing device.

The clock control unit 2250 may maximize the operating performance of the flash memory 2100 by setting a data I/O speed to a normal speed (e.g., AAA Mbps) during normal operation (e.g., as a default). When the flash memory 2100 operates at a maximum data I/O speed (e.g., AAA Mbps), the operating performance of the flash memory 2100 may improve because more data is read and written within a shorter amount of time.

When the storage device 2000 is used at relatively low (cold) temperatures (e.g., less than or equal to about −10° C.), the clock control unit 2250 may decrease the data I/O speed to a first lower data I/O speed (e.g., BBB Mbps), thereby suppressing and/or minimizing a decrease in the operating performance of the flash memory 2100 while also reducing data errors. The clock control unit 2250 may adjust the data I/O speed based on temperature information from the flash memory 2100.

When the storage device 2000 is used at even lower (colder) temperatures (e.g., less than or equal to about −20° C.), the clock control unit 2250 may further decrease the data I/O speed to a second lower data I/O speed (e.g., CCC Mbps). In one example, the second lower data speed may be a minimum value for memory access operations of the storage device 2000. While this may decrease the performance of the storage device 2000, the adjustment may suppress the likelihood that (e.g., prevent) the storage device 2000 does not operate or operates abnormally.

Figure 12:
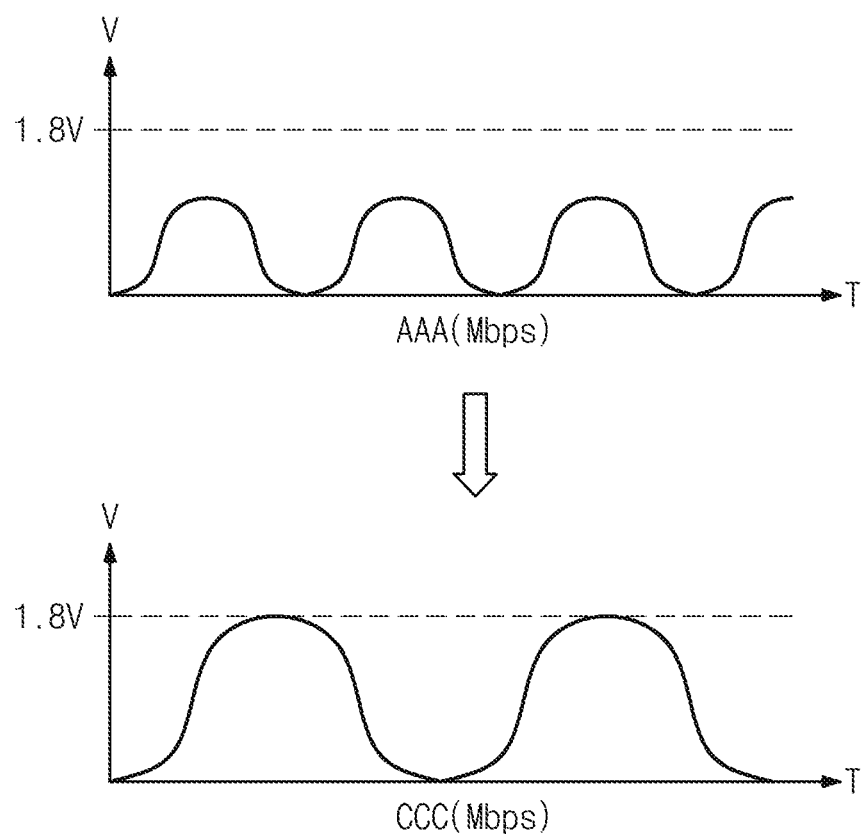
FIG. 12 is a graph illustrating example waveforms of an operating voltage when a data I/O speed is lowered from AAA Mbps to CCC Mbps.

FIG. 12 is a graph schematically illustrating a waveform of an operating voltage when a data I/O speed is lowered from AAA Mbps to CCC Mbps. In this example, the operating voltages of the memory controller 2200 and the flash memory 2100 are assumed to be about 1.8 V.

Referring to FIG. 12, at relatively low temperatures, if the clock control unit 2250 sets the data I/O speed of the flash memory 2100 to AAA Mbps, then the combination of the increase in resistance and the relatively high-speed operation may prevent the operating voltage from completing a full swing. As a result, data error(s) may occur when a storage device 2000 performs relatively high-speed memory access operations at relatively cold temperatures.

If the clock control unit 2250 reduces the data I/O speed to about CCC Mbps at relatively cold temperatures, then the operating voltage may fully swing up to about 1.8V. In this case, a data error generation rate may decrease because the operating voltage fully swings despite the increase in the resistance of a memory cell at relatively cold temperatures.

Storage devices according to one or more example embodiments of inventive concepts may set a data I/O speed to a normal speed or a maximum speed during normal operation (e.g., at temperatures between a first lower threshold temperature $T_{C1}$ and a first upper threshold temperature $T_{H1}$) to improve the performance of a flash memory. At relatively cold temperatures at which resistance of a memory cell transistor varies (e.g., when the temperature of the storage device falls below the first lower threshold temperature), the storage device may lower the data I/O speed to reduce a data error generation rate at these temperatures.

Figure 13:
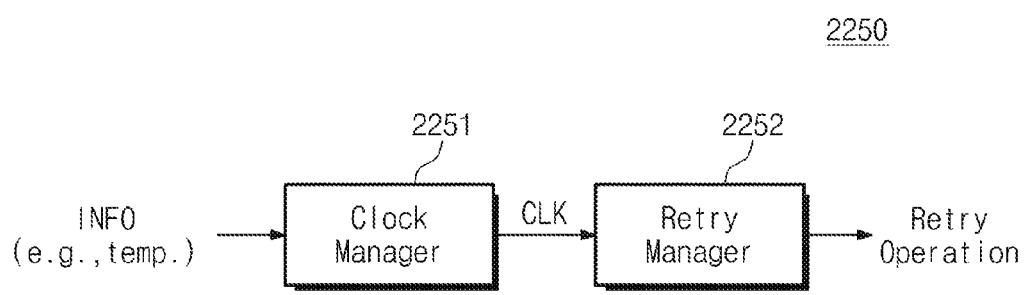
FIG. 13 is a block diagram schematically illustrating an example embodiment of the clock control unit 2250 shown in FIG. 5.

FIG. 13 is a block diagram schematically illustrating an example embodiment of the clock control unit shown in FIG. 5.

Referring to FIG. 13, the clock control unit 2250 includes a clock manager 2251 and a retry manager 2252. The clock manager 2251 and the retry manager 2252 may be implemented as hardware, software executed by hardware, or a combination of hardware and software as discussed above.

In one example, the clock manager 2251 may receive external information INFO, such as a detected temperature from a temperature sensing device, and may adjust a frequency of a clock CLK (also referred to as an operating clock) based on the received information INFO. By adjusting the frequency of the clock CLK, the clock manager 2251 may change a data I/O speed for a memory access operation, or iteration thereof. The clock manager 2251 outputs the adjusted clock CLK to the retry manager 2252.

The retry manager 2252 may perform (or cause the corresponding storage device to perform) a retry process on the flash memory 2100 using a data I/O speed managed by the clock manager 2251. The retry process, as described above with regard to FIG. 4, for example, may be divided into two retry operations.

In a first retry operation, one or more operating conditions (e.g., a voltage level, etc.) may be changed, and then a memory access operation on the flash memory 2100 may be retried using a first data I/O speed (e.g., a normal speed). In a second retry operation, the data I/O speed may be decreased and the memory access operation may again be retried using the changed operating condition and a second data I/O speed (e.g., a decreased speed).

The example embodiment of the clock control unit 2250 shown in FIG. 13 may also perform the methods shown in FIGS. 4 and 26. Because the methods shown in FIGS. 4 and 26 have already been described, a repetitive discussion is not provided here.

Still referring to the example embodiment shown in FIG. 13, according to at least one example embodiment, if an operating error occurs during a read operation at relatively low (cold) temperatures (e.g., less than or equal to about −10° C.), the clock manager 2251 may still maintain a normal speed (e.g., AAA Mbps) as a read speed. In this case, the retry manager 2252 may adjust a read voltage level through a valley search operation based on the normal speed maintained by the clock manager 2251. The retry manager 2252 may then retry the read operation on the flash memory 2100 using the adjusted read voltage level. In this case, the retry manager 2252 may use the normal speed (e.g., AAA Mbps).

In another example, the clock manager 2251 may decrease the read speed to a first lower read speed (e.g., BBB Mbps), and the retry manager 2252 may adjust a read voltage level through a valley search operation based on the first lower read speed. The retry manager 2252 may then retry the read operation on the flash memory 2100 using the adjusted read voltage level and the first lower read speed.

If an operating error occurs during the first retry operation, then the clock manager 2251 may further decrease the read speed to a second lower read speed (e.g., CCC Mbps). In one example, the clock manager 2251 may decrease the read speed based on temperature information from the flash memory 2100. The temperature information may be provided by a temperature sensing device, such as the temperature sensing device 2141 discussed herein. The retry manager 2252 may then perform a second valley search operation based on the second lower read speed (e.g., CCC Mbps) to adjust a read voltage level for the second retry operation. The retry manager 2252 may then retry the read operation using the adjusted read voltage level and the second lower read speed.

Figure 14:
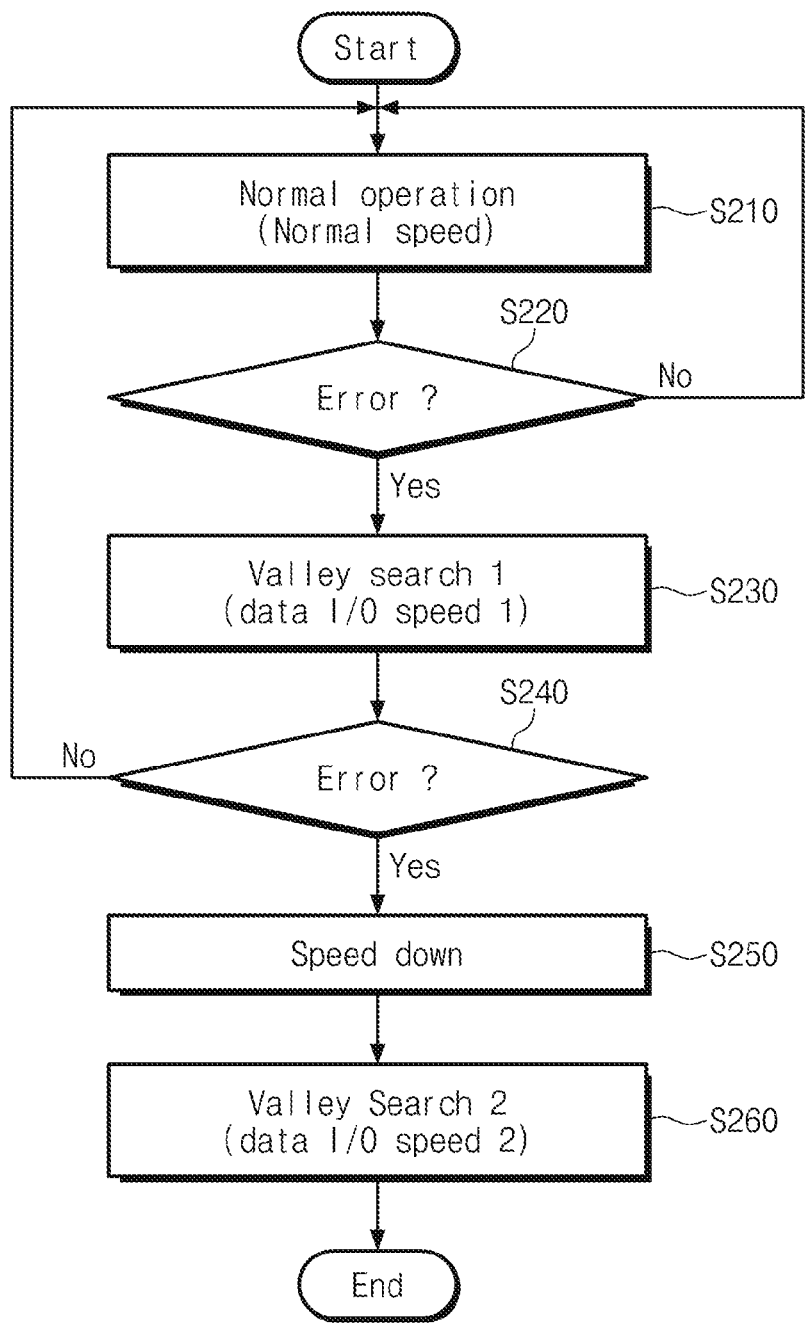
FIG. 14 is a flow chart for describing example operation of the clock control unit 2250 shown in FIG. 5.

FIG. 14 is a flow chart for describing another example operation of an example embodiment of the clock control unit shown in FIG. 5. According to at least this example embodiment, the clock control unit 2250 may set the data I/O speed to a normal speed (e.g., a maximum speed, such as AAA Mbps) during normal operation (e.g., by default). If an error or other problem occurs when the flash memory 2100 operates at a relatively low (cold) temperature, then the clock control unit 2250 may decrease the data I/O speed to a first lower speed (e.g., BBB Mbps or CCC Mbps). In one example, the first lower speed may be determined based on the temperature detected by a temperature sensing device.

Referring in more detail to FIG. 14, at S210 the clock control unit 2250 may operate normally and perform normal operations. During normal operation, a data input/output operation (e.g., a read operation) may be carried out at a normal speed (e.g., AAA Mbps). The clock control unit 2250 may perform normal operation using, for example, a table (e.g., a predefined table (PDT)). The PDT is a table that stores predicted valley search values. According to at least this example embodiment, the clock control unit 2250 may manage memory access operations (also referred to as data input/output operations) for the flash memory 2100 such that the input/output operations are performed at the normal speed according to one or more operating conditions defined in the PDT.

At S220, the clock control unit 2250 determines whether an operating error of the flash memory 2100 occurs during the normal operation and/or whether input/output data includes an error. The clock control unit 2250 may determine whether an operating error occurs during the normal operation and/or whether input/output data includes an error in the same or substantially the same manner as discussed above with regard to S120 in FIG. 4.

If an operating error of the flash memory 2100 does not occur and the input/output data does not include an error (No), then returning to S210, the clock control unit 2250 maintains the normal speed and the flash memory 2100 continues normal operation.

If the clock control unit 2250 determines that an operating error occurs and/or input/output data includes an error (Yes), then the clock control unit 2250 may perform a valley search operation in response to the determined operating error and/or error included in the input/output data.

For example, if the input/output data includes an error, then at S230 the clock control unit 2250 performs a first valley search operation. The retry manager 2252 (FIG. 13) may adjust an operating voltage level (e.g., a read voltage level) through the first valley search operation. The retry manager 2252 may then retry the memory access operation (e.g., the read operation) on the flash memory 2100 using the adjusted operating voltage level. In this case, the retry manager 2252 may retry the memory access operation on the flash memory 2100 using a first data I/O speed. In this example, the first data I/O speed may be a normal speed (e.g., AAA Mbps). In another example, the clock control unit 2250 may decrease the data I/O speed to a first lower speed (e.g., BBB Mbps), and the retry manager 2252 may adjust the operating voltage level based on the first lower speed. The retry manager 2252 may then retry the memory access operation on the flash memory 2100 using the first lower speed and the adjusted operating voltage level.

Still referring to FIG. 14, at S240 the clock control unit 2250 may determine whether an operating error occurs and/or the input/output data includes an error during the first retry operation. The clock control unit 2250 may determine whether an operating error occurs and/or whether input/output data includes an error during the first retry operation in the same or substantially the same manner as discussed above with regard to S220.

If an operating error does not occur and the input/output data does not include an error (No), then the clock control unit 2250 may maintain the first data I/O speed (e.g., a normal speed or first lower speed). The process then returns to S210 and the flash memory 2100 continues normal operation using the first speed and the operating voltage level calculated at S230.

Returning to S240, if an operating error occurs and/or the input/output data includes an error (Yes), then at S250 the clock control unit 2250 decreases the data I/O speed relative to the first data I/O speed used during normal operation and/or the first retry operation. According to at least some example embodiments, the clock manager 2251 may decrease an operating speed based on temperature information from the flash memory 2100. In one example, the clock manager 2251 may decrease the operating speed based on temperature as discussed herein with regard to FIGS. 25 and 26.

At S260, the clock control unit 2250 performs a second valley search operation based on the decreased data I/O speed. In one example, the retry manager 2252 may adjust an operating voltage level (e.g., a read voltage level) by performing the second valley search operation based on the decreased data I/O speed (e.g., CCC Mbps).

The retry manager 2252 may then perform a second retry operation on the flash memory 2100 using the decreased data I/O speed and the adjusted operating voltage level. In so doing, another iteration of the memory access operation may be performed on the flash memory 2100.

If an error occurs during the second retry operation, then the retry manager 2252 may output an error. If, however, an error does not occur, then the decreased data I/O speed and adjusted operating voltage level may be utilized for normal operation going forward.

As described above, the storage device 2000 according to at least one example embodiment of inventive concepts includes a clock control unit 2250 located at the memory controller 2200, wherein the clock control unit 2250 is configured to adjust a data I/O speed for the storage device 2000. According to at least some example embodiments, the clock control unit 2250 may adjust the data I/O speed in response to, for example, occurrence of an operating error at the storage device 2000 at least partially caused by variations in environmental conditions (e.g., surrounding environmental conditions, such as temperature, pressure, etc., of the storage device) to restore and/or correct error(s) in input/output data.

Figure 15:
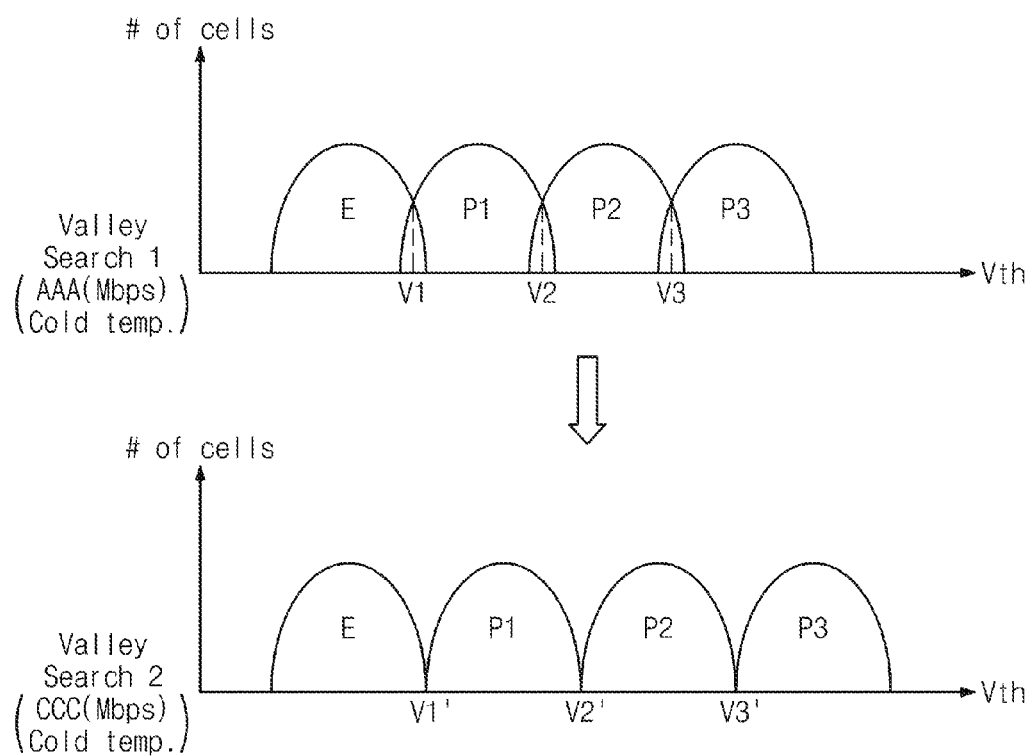
FIG. 15 is a diagram for describing example embodiments of the first and second valley search operations shown in FIG. 14.

FIG. 15 is a diagram for describing example embodiments of the first and second valley search operations discussed above with regard to FIG. 14. For example purposes, the diagram shown in FIG. 15 will be described with regard to the clock control unit 2250 and the flash memory 2100.

Referring to FIG. 15, the flash memory 2100 may store one or more data bits per memory cell. In one example, a memory cell may store 2-bit data. In this case, each memory cell may have a threshold voltage distribution corresponding to one of an erase state E and three program states P1 to P3.

As mentioned above, resistance values of memory cells may increase at relatively low (cold) temperature and/or relatively high speeds (e.g., AAA Mbps). As a result, adjacent threshold voltage distributions may overlap as illustrated in FIG. 15. In this case, the clock control unit 2250 may search for first valley search values V1, V2, and V3 through a first valley search operation. As discussed above, the clock control unit 2250 may perform the first retry operation using the identified valley search values.

After decreasing the data I/O speed, the clock control unit 2250 may perform a second valley search operation. For example, if the data I/O speed is lowered to CCC Mbps, improved threshold voltage distributions may be obtained.

In this example, as illustrated in FIG. 15, the clock control unit 2250 may search for second valley search values V1', V2', and V3' through a second valley search operation. The clock control unit 2250 may store the second valley search values V1', V2', and V3' identified through the second retry operation and use the identified values for a next operation of the flash memory 2100. In one example, the second valley search values V1', V2', and V3' may be stored at a RAM 2240 (refer to FIG. 5).

As discussed above with regard to FIG. 14, the clock control unit 2250 may then perform the second retry operation using the reduced data I/O speed and the identified second valley search values.

When a further memory access operation (e.g., a read operation) is performed on the flash memory 2100 after the second retry operation, the storage device 2000 may use the stored second valley search values V1', V2', and V3'. That is, the clock control unit 2250 may perform a memory access operation on the flash memory 2100 at a normal speed (e.g., AAA Mbps), but using the second valley search values V1', V2', and V3'.

The storage device 2000 according to at least one example embodiment may include the clock control unit 2250 in the memory controller 2200, and the memory controller 2200 may adjust a data I/O speed through the clock control unit 2250. According to at least this example embodiment, a frequency of a clock for data input/output of the flash memory 2100 may be lowered at relatively low (cold) temperature (e.g., less than or equal to about −10° C.), the clock frequency may be set to a relatively high value at warmer temperatures (e.g., about 20° C. or between about −10° C. and about 85° C.), and the frequency of the clock may be lowered at relatively hot temperatures (e.g., greater than or equal to about 85° C.). Accordingly, the performance of the storage device 2000 may be improved and/or maximized, while reducing and/or minimizing operating errors.

According to at least some other example embodiments, the clock control unit 2250 may be implemented at the flash memory 2100 or a host (not shown), rather than the memory controller 2200. For example, the clock control unit 2250 may be placed outside a storage device embedded in a smart phone or a table PC, and may be implemented to adaptively cope with variations in a peripheral environmental conditions such as a temperature.

Figure 16:
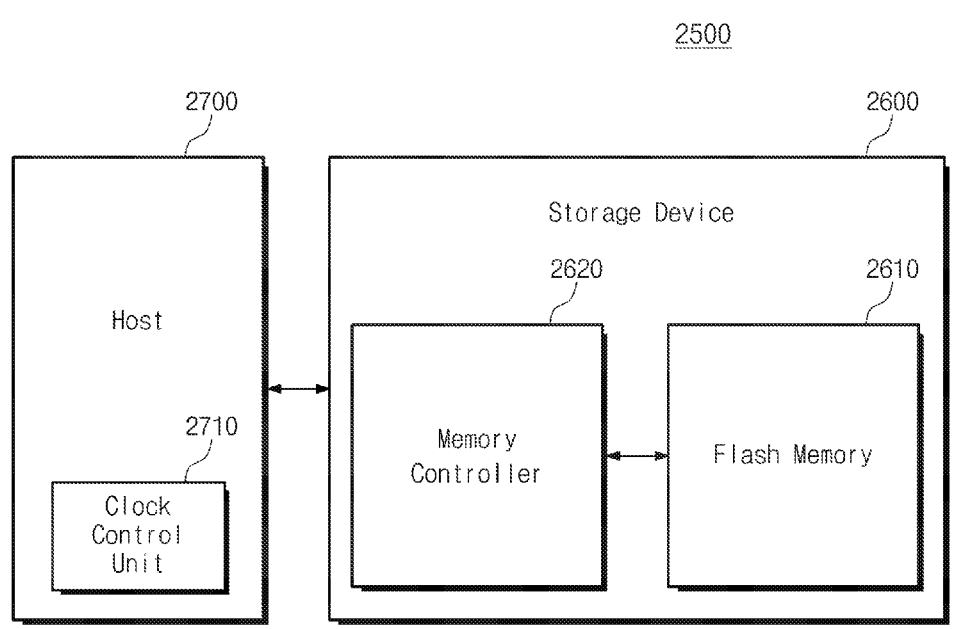
FIG. 16 is a block diagram schematically illustrating an example embodiment in which a clock control unit is implemented in a host.

FIG. 16 is a block diagram schematically illustrating an example embodiment in which a clock control unit is included in a host.

Referring to FIG. 16, a memory system 2500 includes a storage device 2600 and a host 2700. The storage device 2600 includes a flash memory 2610 and a memory controller 2620. The host 2600 includes a clock control unit 2710.

In the example embodiment shown in FIG. 16, the host 2700 may adjust a data I/O speed (e.g., a CPU clock) of the memory controller 2620 or a data I/O speed of the flash memory 2610 via the clock control unit 2710. The clock control unit 2710 may receive environmental condition information (e.g., temperature information, pressure information, etc.) from the memory controller 2620 and/or from within the host 2700, and may adjust the data I/O speed based on the received information.

According to at least some example embodiments, a frequency of a CPU clock and/or a frequency of a clock for data input/output from/to the flash memory 2610 may be lowered at relatively low (cold) temperatures, the clock frequency may be set relatively high at warmer temperatures, and the frequency of the clock may be lowered at relatively hot temperatures. Accordingly, performance of the memory system 2500 may be improved and/or maximized, while reducing and/or minimizing operating errors.

Figure 17:
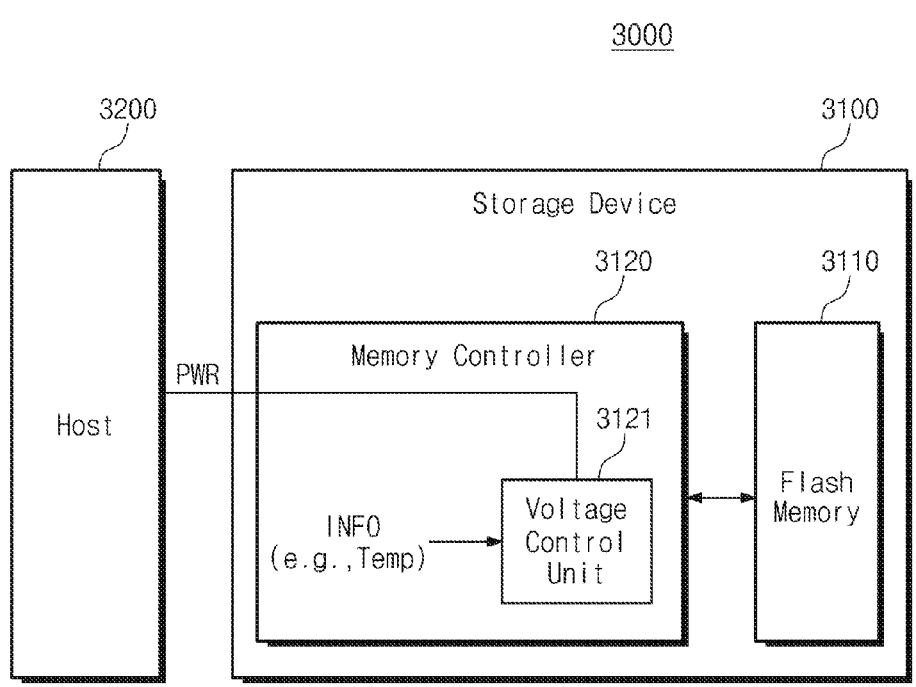
FIG. 17 is a block diagram schematically illustrating a memory system according to another example embodiment of inventive concepts.

FIG. 17 is a block diagram schematically illustrating a memory system according to still another example embodiment of inventive concepts.

Referring to FIG. 17, a memory system 3000 includes a storage device 3100 and a host 3200. The storage device 3100 includes a flash memory 3110 and a memory controller 3120. In this example, the memory controller 3120 includes a voltage control unit 3121.

As described above, in the storage device 3000 including a memory system such as the flash memory 3110, degradation of a memory characteristic and generation of an errors may be caused due to variations in environmental conditions (e.g., temperature, pressure, weather, etc.). In this case, an operating voltage (e.g., a read and/or write voltage) may be controlled to reduce error bits and/or improve data reliability.

In more detail, the voltage control unit 3121 may receive environmental condition information (e.g., temperature information, pressure information, etc.), and adjust an operating voltage to be provided to the flash memory 3110 based on the received information.

The voltage control unit 3121 may receive an external power PWR from the host 3200, and regulate (or adjust) the received external power into an operating voltage to be provided to the flash memory 3110 using, for example, a voltage regulator. If the environmental condition information is temperature information, then the temperature information may be provided to the voltage control unit 3121 by a temperature sensing device (e.g., the temperature sensing device 2141) in the flash memory 3110 or in the memory controller 3100.

According to at least one example embodiment, if an operating error occurs at the flash memory 3110 during a memory access operation (e.g., a read or write operation), then the voltage control unit 3121 may increase the operating voltage to a first increased operating voltage, and a first retry operation may be performed using the first increased operating voltage. In performing the first retry operation, a second iteration of the memory access operation may be performed.

If an error occurs during the first retry operation, then the voltage control unit 3121 may further increase the operating voltage for the memory access operation to a second increased operating voltage. A second retry operation may then be performed on the flash memory 3110 using the second increased operating voltage, which is higher than the first increased operating voltage. In performing the second retry operation, a third iteration of the memory access operation may be performed.

According to at least some example embodiments, the voltage control unit 3121 may increase the operating voltage for the flash memory 3110 based on variations in temperature sensed by a temperature sensing device.

Figure 27:
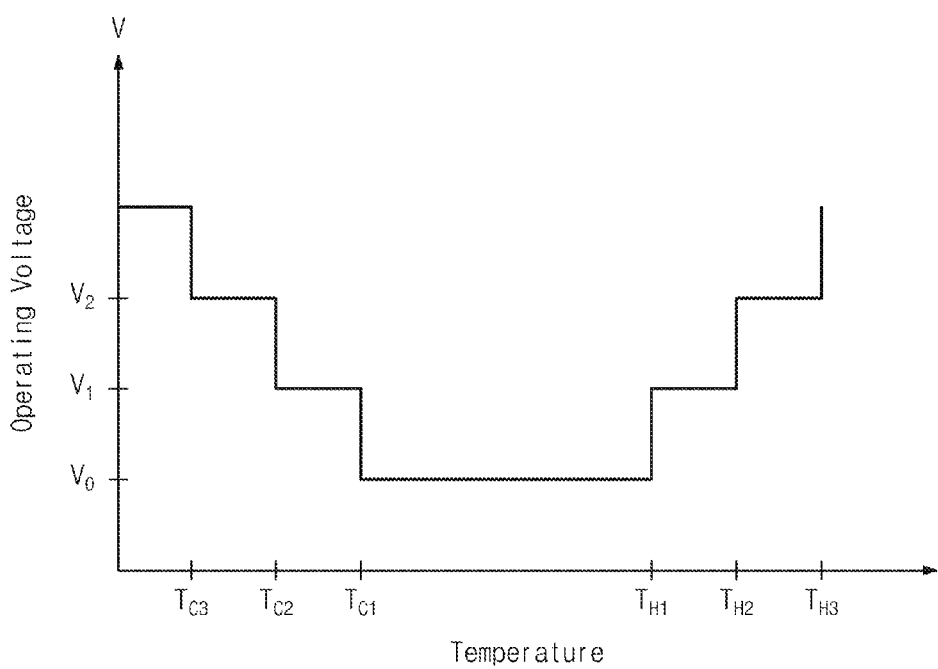
FIG. 27 is a graph of operating voltage versus temperature for describing example operation of a voltage control unit according to an example embodiment of inventive concepts.

FIG. 27 is a graph of operating voltage versus temperature. The graph shown in FIG. 27 illustrates an example in which the voltage control unit 3121 increases the operating voltage for memory access operations on the flash memory 3100 in a step-wise manner as the temperature of the flash memory 3100 decreases below one or more lower threshold temperature values. The graph shown in FIG. 27 also illustrates an example in which the voltage control unit 3121 decreases the operating voltage for the flash memory 3100 in a step-wise manner as the temperature of the flash memory 2100 increases above one or more upper threshold temperature values.

In more detail with regard to FIG. 27, if the temperature of the flash memory 3100 is between a first lower threshold temperature $T_{C1}$ and first upper threshold temperature $T_{H1}$, then the voltage control unit 3121 maintains the operating voltage for the flash memory 3100 at a first (e.g., normal) operating voltage (e.g., $V_0$) of about 2.7 V.

If the temperature sensing device detects that the temperature of the flash memory 3100 falls below the first lower threshold temperature $T_{C1}$, then the temperature sensing device 2141 may output temperature information indicative of this temperature change to the voltage control unit 3121. In response to the received temperature information, the voltage control unit 3121 may increase the operating voltage from the first operating voltage to a first increased operating voltage $V_1$ of about 3.0 V. As the temperature sensing device 2141 detects further decreases in temperature (e.g., below a second lower threshold temperature $T_{C2}$, a third lower threshold temperature $T_{C3}$, etc.), the voltage control unit 3121 may continue to increase the operating voltage for the flash memory 3100 in a step-wise manner until the operating voltage reaches a maximum operating voltage (e.g., about 3.6 V). The operating voltage may be increased in increments of about 0.1 V, 0.2 V, 0.5 V, or any other suitable voltage value.

If the temperature sensing device detects that the temperature of the flash memory 3100 rises above the first upper threshold temperature $T_{H1}$, then the temperature sensing device 2141 may output temperature information indicative of this temperature change to the voltage control unit 3121. In response to the received temperature information, the voltage control unit 3121 may increase the operating voltage in the same or substantially the same manner as discussed above with regard to decreases in the temperature below the lower threshold temperature values.

According to at least some example embodiments, if an operating voltage of the flash memory 3110 is set relatively high, operating errors of the flash memory due to temperature variations (e.g., increases and/or decreases) may be suppressed. For example, if an operating voltage of the flash memory 3110 ranges between 2.7 V and 3.6 V, inclusive, and is increased from 2.7 V to 3.0 V in response to detecting that the temperature of the flash memory 3110 has fallen below a first threshold temperature, then operating and/or data error(s) may be reduced even though the flash memory 3100 operates at normal (and relatively high) speeds (e.g., AAA Mbps).

Figure 18:
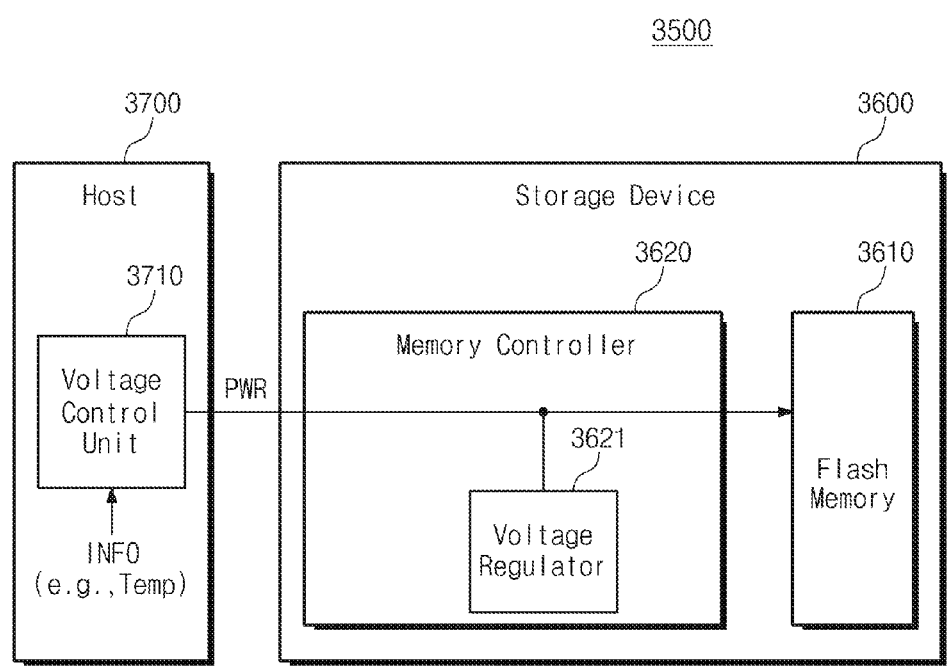
FIG. 18 is a block diagram schematically illustrating a memory system according to yet another example embodiment of inventive concepts.

FIG. 18 is a block diagram schematically illustrating a memory system according to yet another example embodiment of inventive concepts.

Referring to FIG. 18, a memory system 3500 includes a storage device 3600 and a host 3700. The storage device 3600 includes a flash memory 3610 and a memory controller 3620. The memory controller 3620 includes a voltage regulator 3621, and the host 3700 includes a voltage control unit 3710.

As illustrated in FIG. 18, a power PWR of the host 3700 may be provided (e.g., directly) to the flash memory 3610 according to a type of the memory system 3500. In this case, the voltage control unit 3710 of the host 3700 may adjust an operating voltage of the flash memory 3610, and output the adjusted operating voltage to the storage device 3600.

The voltage control unit 3710 may receive environmental condition information (e.g., temperature information, pressure information, etc.) from the memory controller 3620 or from within the host 3700, and may adjust the operating voltage of the flash memory 3610 based on the received environmental condition information. The voltage control unit 3710 may adjust the operating voltage of the flash memory 3610 in the same or substantially the same manner as discussed above with regard to the voltage control unit 3121 shown in FIG. 17. Thus, a detailed discussion is omitted.

Figure 19:
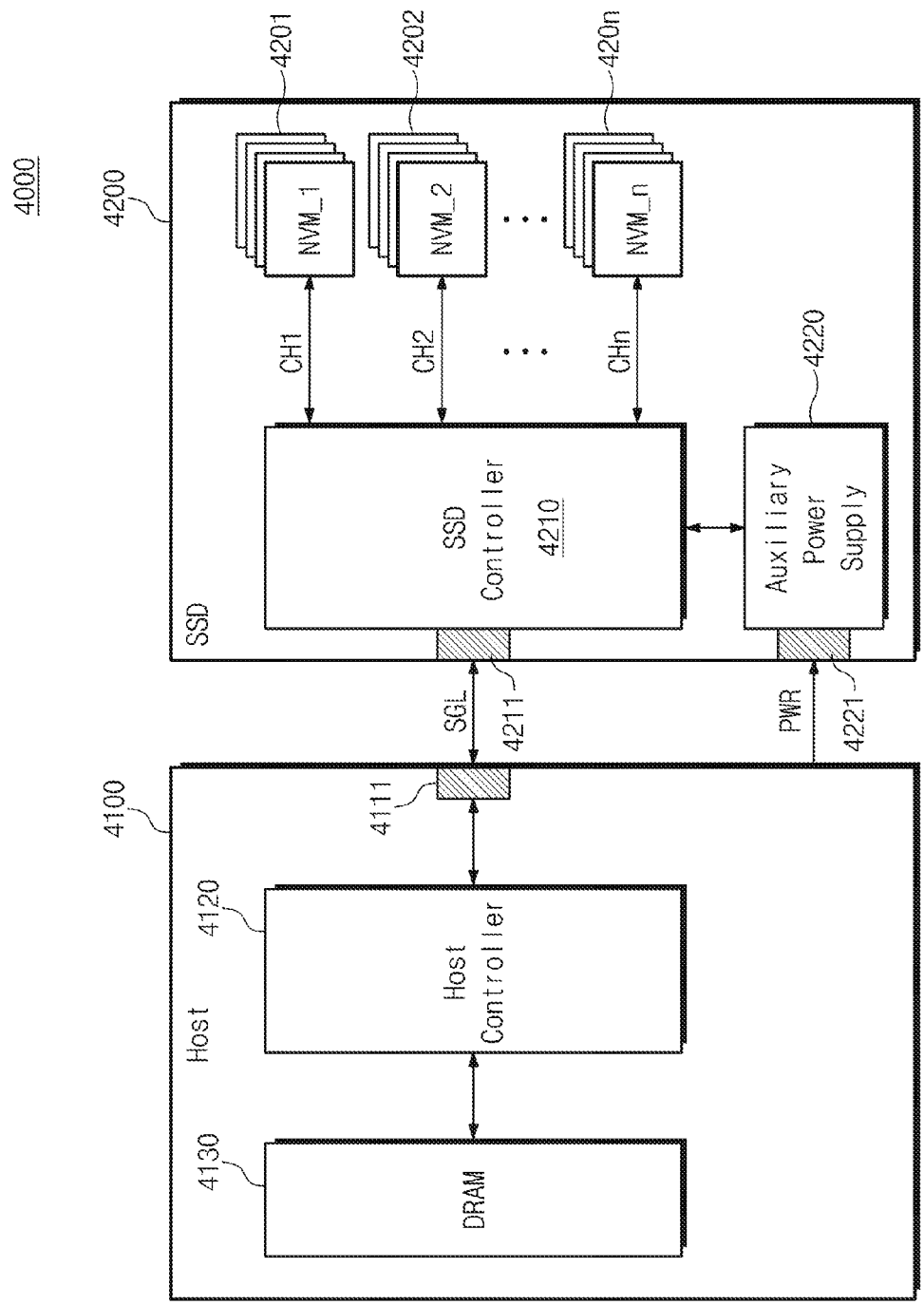
FIG. 19 is a block diagram illustrating a solid-state drive (SSD) system including a memory system according to an example embodiment of inventive concepts.

FIG. 19 is a block diagram illustrating a solid state drive system including a memory system according to an example embodiment of inventive concepts.

Referring to FIG. 19, a solid state drive (SSD) system 4000 includes a host 4100 and an SSD 4200. The host 4100 includes: a host interface 4111; a host controller 4120; and a DRAM 4130.

The host may write data at the SSD 4200, or may read data stored in the SSD 4200. The host controller 4120 may provide signals SGL, such as command signals, address signals, control signals, etc., to the SSD 4200 through the host interface 4111. The DRAM 4130 may be a main memory of the host 4100.

The SSD 4200 may exchange the signal SGL with the host 4100 through the host interface 4211, and may be supplied with a power through a power connector 4221. The SSD 4200 includes: a plurality of nonvolatile memories 4201 to 420n; an SSD controller 4210; and an auxiliary power supply 4220. Herein, the nonvolatile memories 4201 to 420n may be implemented with nonvolatile memories, such as a PRAM, an MRAM, a ReRAM, a FRAM, etc., as well as a 2D and/or 3D NAND flash memory. The plurality of nonvolatile memories 4201 to 420n may be used as a storage medium of the SSD 4200.

The plurality of nonvolatile memories 4201 to 420n are connected to the SSD controller 4210 through a plurality of channels CH1 to CHn. One channel may be connected with one or more nonvolatile memories. Nonvolatile memories connected with one channel are connected to the same data bus.

The SSD controller 4210 may exchange the signal SGL with the host 4100 through the host interface 4211. Here, the signal SGL may include commands, addresses, data, etc. The SSD controller 4210 may be configured to write data to, or read data from, a corresponding nonvolatile memory according to commands from the host 4100. An example embodiment of the SSD controller 4210 will be described in more detail with reference to FIG. 20.

The auxiliary power supply 4220 is connected to the host 4100 through the power connector 4221. The auxiliary power supply 4220 may be charged by a power PWR from the host 4100. In this example embodiment, the auxiliary power supply 4220 is arranged within the SSD 4200. However, in at least some other example embodiments, the auxiliary power supply 4220 may be arranged outside the SSD 4200. For example, the auxiliary power supply 4220 may be arranged on a main board to supply an auxiliary power to the SSD 4200.

Figure 20:
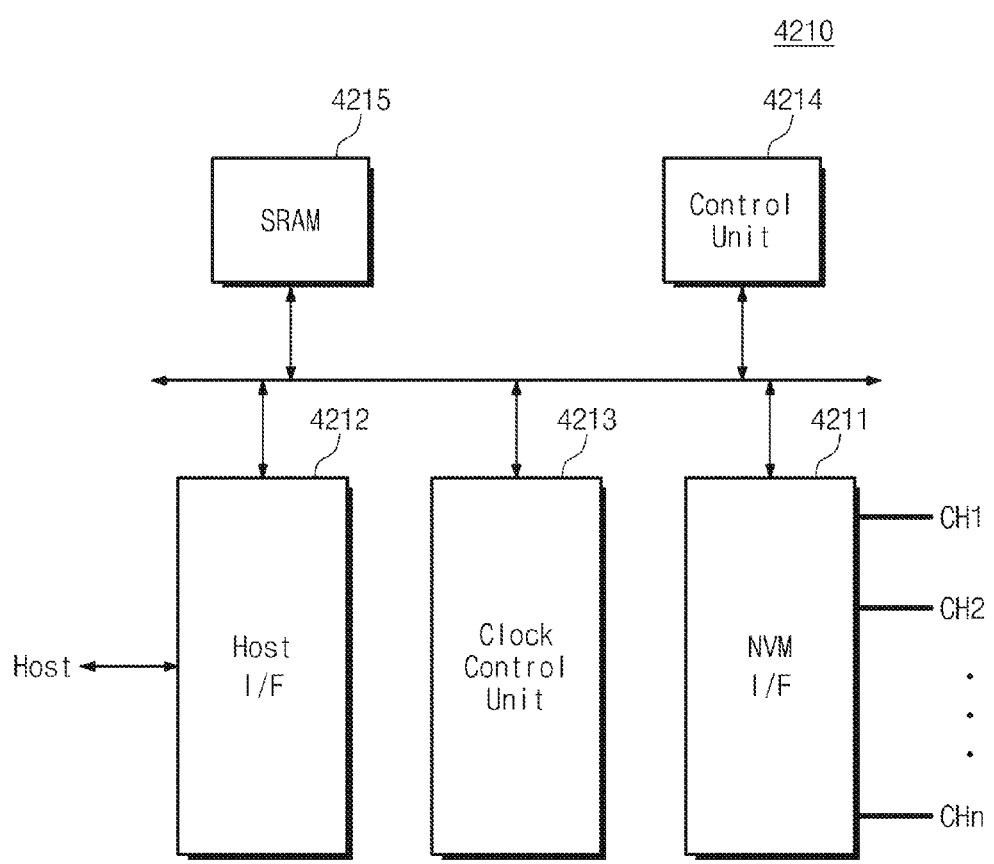
FIG. 20 is a block diagram schematically illustrating an example embodiment of the SSD controller shown in FIG. 19.

FIG. 20 is a block diagram schematically illustrating an example embodiment of the SSD controller 4210 shown in FIG. 19.

Referring to FIG. 20, the SSD controller 4210 includes: an NVM interface 4211; a host interface 4212; a clock control unit 4213; a control unit 4214; and an SRAM 4215.

The NVM interface 4211 may distribute data transferred from a main memory of a host 4100 to channels CH1 to CHn, respectively. The NVM interface 4211 may also transfer data read from nonvolatile memories 4201 to 420n to the SRAM 4215.

The host interface 4212 may interface with an SSD 4200 according to the protocol of the host 4100. The host interface 4212 may communicate with the host 4100 using, for example, one or more of the following protocols: USB (Universal Serial Bus), SCSI (Small Computer System Interface), PCI express, ATA, PATA (Parallel ATA), SATA (Serial ATA), SAS (Serial Attached SCSI), etc.

The host interface 4212 may perform a disk emulation function which enables the host 4100 to recognize the SSD 4200 as a hard disk drive (HDD).

The clock control unit 4213 may be the same or substantially the same as other example embodiments of the clock control unit discussed herein. In this regard, the clock control unit 4213 may be configured to adjust a frequency of a clock for performing memory access operations and/or adjust a data I/O speed (and/or other operating conditions) for performing memory access operations. According to at least some example embodiments, a frequency of a clock (and/or other operating conditions) for data input/output of the nonvolatile memories 4201 to 420n may be adjusted in response to detecting variations in environmental conditions, such as temperature, pressure, etc. In one example, the frequency of the clock for data input/output may be decreased at relatively low (cold) temperatures, set relatively high at warmer temperatures, such as room temperature, and decreased at relatively hot temperatures. Accordingly, the performance of a SSD system 4000 may be improved and/or maximized, while reducing and/or minimizing operating errors.

Still referring to FIG. 20, the control unit 4214 may analyze and process the signal SGL from a host 4100. The control unit 4214 may control the host 4100 and/or the nonvolatile memories 4201 to 420n through the host interface 4212 and/or the NVM interface 4211, respectively. The control unit 4214 may control the nonvolatile memories 4201 to 420n according to, for example, firmware for driving the SSD 4200.

The SRAM 4215 may be used to drive software for managing the nonvolatile memories 4201 to 420n more efficiently. Also, the SRAM 4215 may store metadata from a main memory of the host 4100 and/or may store cache data. At a sudden power-off operation, metadata and/or cache data stored at the SRAM 4215 may be stored at nonvolatile memories 4201 to 420n using the auxiliary power supply 4220.

Figure 21:
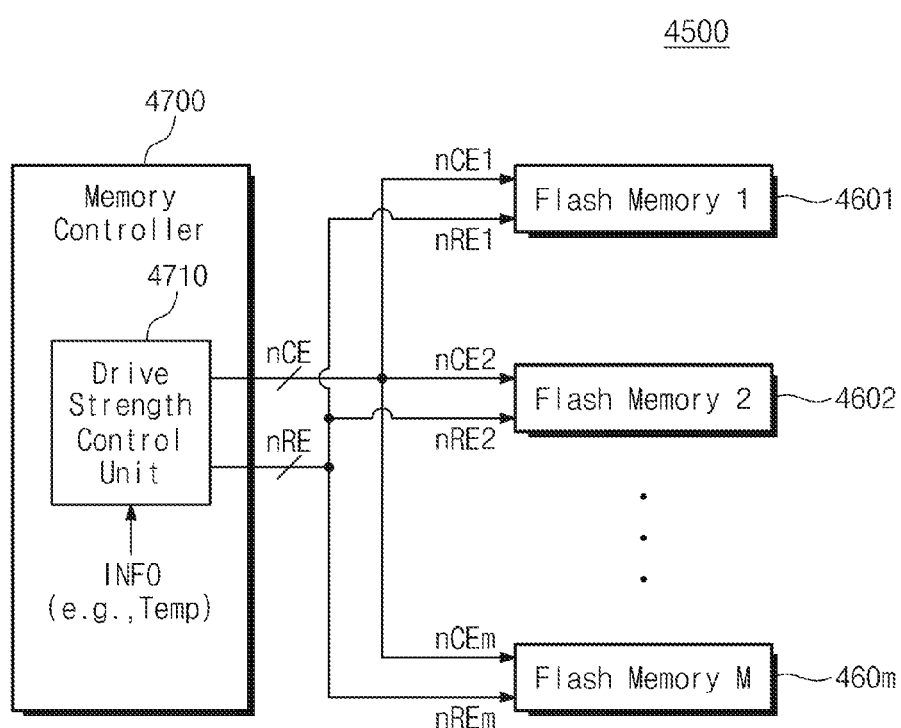
FIG. 21 is a block diagram schematically illustrating a storage device according to an example embodiment of inventive concepts.

FIG. 21 is a block diagram schematically illustrating a storage device according to another example embodiment of inventive concepts.

Referring to FIG. 21, a storage device 4500 includes a plurality of flash memories 4601 to 460m and a memory controller 4700.

The memory controller 4700 may select at least one of the flash memories 4601 to 460m through a chip enable signal nCE. The memory controller 4700 may read data from the selected flash memory through a read enable signal nRE. For example, the memory controller 4700 may read data from the first flash memory 4601 through a first chip enable signal nCE1 and a first read enable signal nRE1. The memory controller 4700 may read data from the m-th flash memory 460m through an m-th chip enable signal nCEm and an m-th read enable signal nREm.

The memory controller 4700 includes a drive strength control unit 4710. According to at least some example embodiments, the drive strength D/S refers to a strength for driving a flash memory. In this regard, the higher the drive strength, the greater the number of flash memories that may be driven by the memory controller 4700.

As with the clock control unit and the voltage control unit discussed with regard to other example embodiments, the drive strength control unit 4710 may receive environmental condition information (e.g., temperature information, pressure information, etc.) from one or more of the flash memories 4601 to 460m or the memory controller 4700, and may adjust the drive strength for the storage device 4500 based on the received environmental condition information.

In one example, if the environmental condition information is temperature information, the drive strength control unit 4710 may adjust the drive strength for the storage device 4500 based on the temperature information from a temperature sensing device at one or more of the flash memories 4601 to 460m or at the memory controller 4700.

The drive strength control unit 4710 may adjust the drive strength through a chip enable signal.

According to at least some example embodiments, by adjusting the drive strength at relatively low (cold) temperatures, operating and/or data errors may be reduced even though the storage device 4500 continues to operate at a normal (e.g., relatively high) speed (e.g., AAA Mbps).

Figure 28:
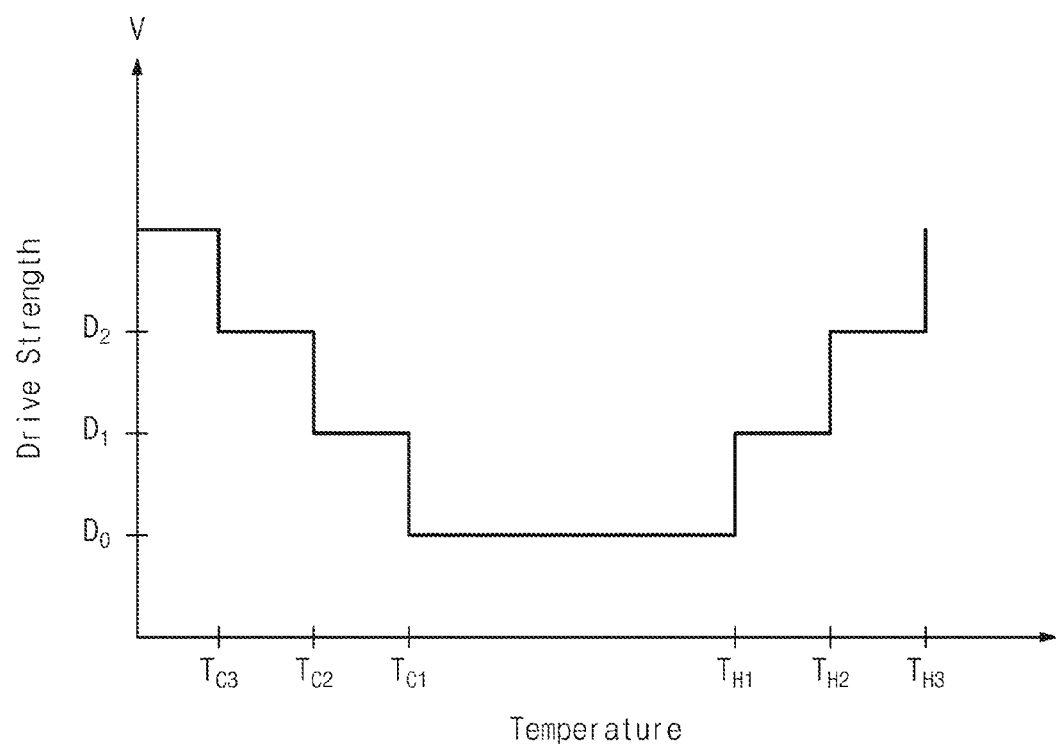
FIG. 28 is a graph of drive strength versus temperature for describing example operation of a drive strength control unit according to an example embodiment of inventive concepts.

FIG. 28 is a graph of drive strength versus temperature. The graph shown in FIG. 28 illustrates an example in which the drive strength control unit 4710 increases the drive strength for the storage device 4500 in a step-wise manner as the temperature of the storage device decreases below one or more lower threshold temperature values. The graph shown in FIG. 28 also illustrates an example in which the drive strength control unit 4710 increases the drive strength for the storage device 4500 in a step-wise manner as the temperature of the storage device 4500 increases above one or more upper threshold temperature values.

In more detail with regard to FIG. 28, if the temperature of the storage device 4500 (e.g., as detected by a temperature sensing device) is between a first lower threshold temperature $T_{C1}$ and first upper threshold temperature $T_{H1}$, then the drive strength control unit 4710 maintains the drive strength for the storage device 4500 at a first (e.g., normal) drive strength $D_0$. According to at least some example embodiments, the first drive strength $D_0$ may be about 35 ohms, and the drive strength may range from about 20 ohms to about 70 ohms through an adjustment procedure referred to as impedance matching between the memory controller 4700 and the storage device 4500. The storage device 4500 sets the initial drive strength value and then measures signal integrity. After the repeated calibration, the storage device 4500 sets the initial drive strength $D_0$.

If the temperature sensing device detects that the temperature of the storage device 4500 falls below the first lower threshold temperature $T_{C1}$, then the temperature sensing device may output temperature information indicative of this temperature change to the drive strength control unit 4710. In response to the received temperature information, the drive strength control unit 4710 may increase the drive strength from the first drive strength voltage $D_0$ to a first increased drive strength $D_1$. As the temperature sensing device detects further decreases in temperature (e.g., below a second lower threshold temperature $T_{C2}$, a third lower threshold temperature $T_{C3}$, etc.), the drive strength control unit 4710 may continue to increase the operating voltage for the storage device 4500 in a step-wise manner (e.g., to drive strength $D_2$, etc.) until the drive strength reaches a maximum drive strength.

If the temperature sensing device detects that the temperature of the flash memory 4500 rises above the first upper threshold temperature $T_{H1}$, then the temperature sensing device may output temperature information indicative of this temperature change to the drive strength control unit 4710. In response to the received temperature information, the drive strength control unit 4710 may increase the drive strength in the same or substantially the same manner as discussed above with regard to decreases in the temperature below the lower threshold temperature values.

Figure 22:
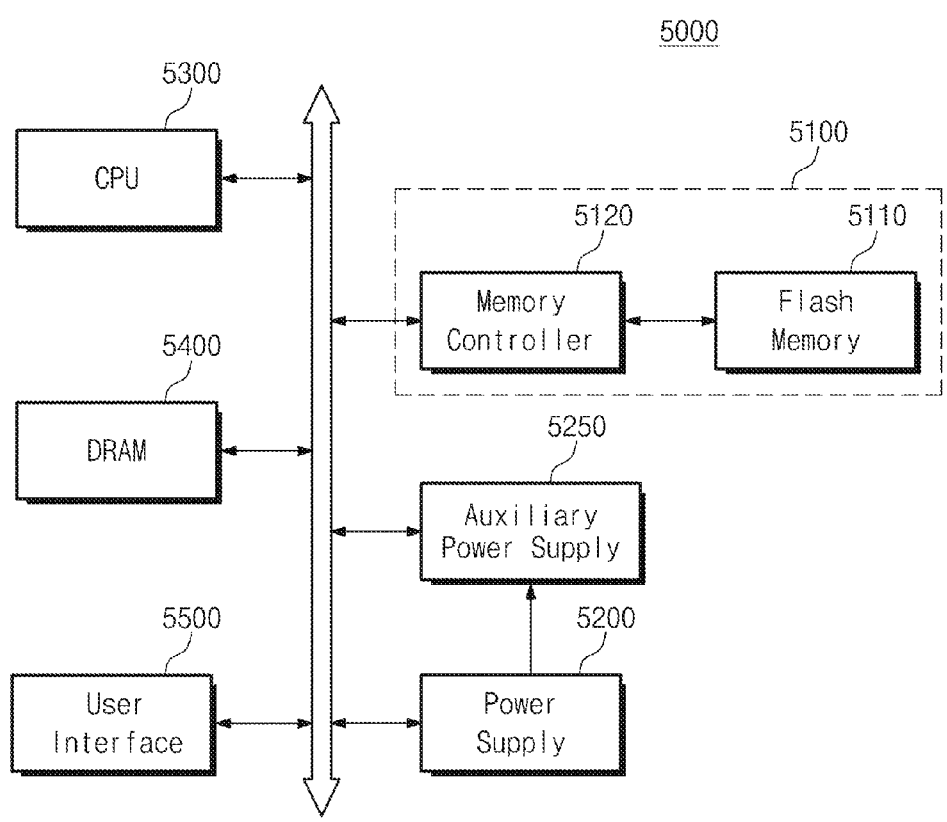
FIG. 22 is a block diagram schematically illustrating an electronic device including a memory system according to an example embodiment of inventive concepts.

FIG. 22 is a block diagram schematically illustrating an electronic device including a memory system according to an example embodiment of inventive concepts. In at least this example embodiment, the electronic device 5000 may be a personal computer or a portable electronic device such as a notebook computer, a Personal Digital Assistant (PDA), a camera, etc.

Referring to FIG. 22, the electronic device 5000 includes: a memory system 5100; a power supply device 5200; an auxiliary power supply 5250; a Central Processing Unit (CPU) 5300; a DRAM 5400; and a user interface 5500. The memory system 5100 includes a flash memory 5110 and a memory controller 5210. The memory system 5100 may be embedded in the electronic device 5000, or removable from the electronic device 5000.

As described above, the electronic device 5000 according to at least this example embodiment of inventive concepts may adjust a data I/O speed using a clock control unit of the memory system 5100. According to at least one example embodiment, a frequency of a clock for data input/output of the flash memory 5110 may be lowered at relatively low (cold) temperatures (e.g., less than or equal to about −10° C.), may be set to a relatively high value (e.g., a maximum) at warmer temperatures (e.g., about 20° C. or between about −10° C. and about 85° C.), and may be lowered at relatively hot temperatures (e.g., greater than or equal to about 85° C.). Accordingly, performance of the electronic device 5000 may be improved and/or maximized, while reducing and/or minimizing operating errors thereof.

Figure 23:
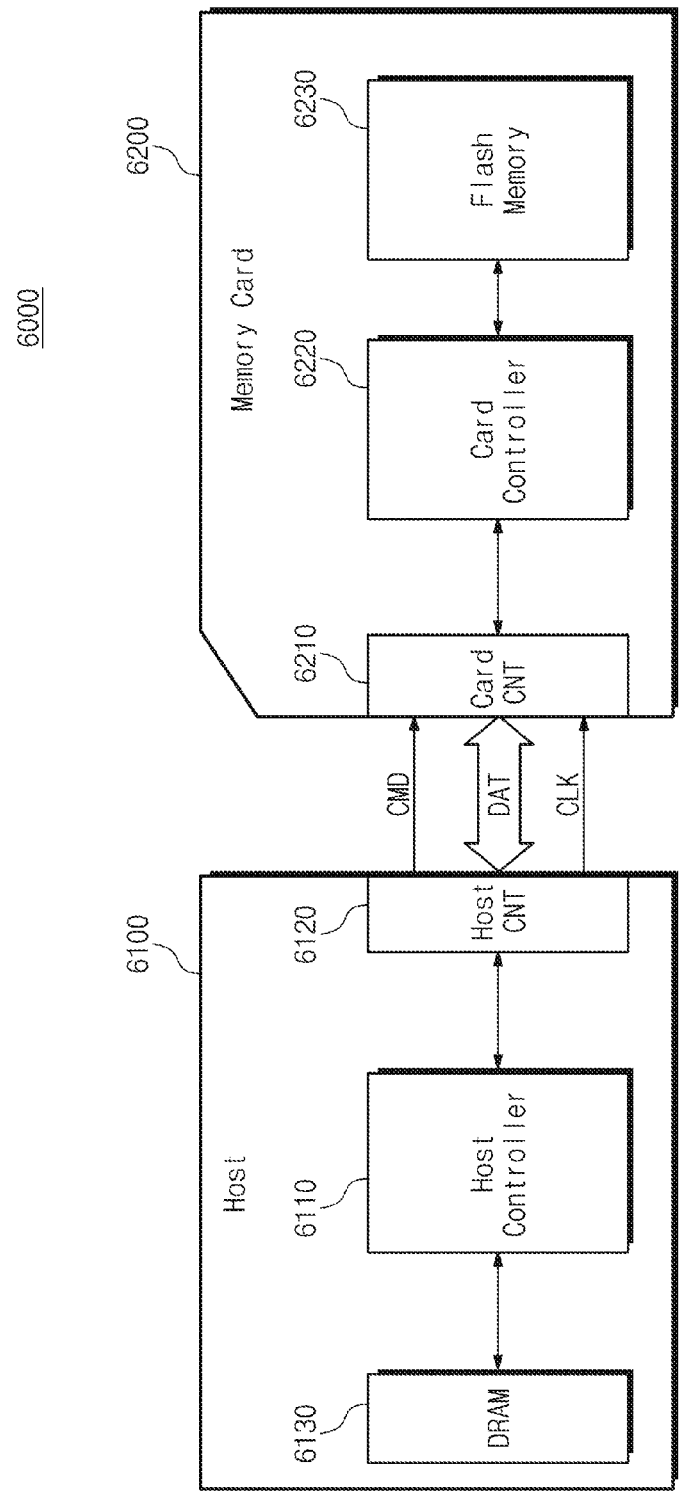
FIG. 23 is a block diagram schematically illustrating a memory card system including a memory system according to an example embodiment of inventive concepts.

FIG. 23 is a block diagram schematically illustrating a memory card system including a memory system according to an example embodiment of inventive concepts.

Referring to FIG. 23, a memory card system 6000 includes a host 6100 and a memory card 6200. The host 6100 includes: a host controller 6110; a host connection unit 6120; and a DRAM 6130.

The host 6100 may write data to, and read data from, the memory card 6200. The host controller 6110 may send a command (e.g., a read command, a write command, etc.), a clock signal CLK generated from a clock generator (not shown) in the host 61100, and/or data, to the memory card 6200 through the host connection unit 6120. The DRAM 6130 may be a main memory of the host 6100.

The memory card 6200 includes: a card connection unit 6210; a card controller 6220; and a flash memory 6230. The card controller 6220 may store data at the flash memory 6230 in response to a command input through the card connection unit 6210. The data may be stored in synchronization with a clock signal generated from a clock generator (not shown) in the card controller 6220. The flash memory 6230 may store data transferred from the host 6100. For example, in a case where the host 6100 is a digital camera, the flash memory 6230 may store image data.

The host controller 6110 or the card controller 6220 may include a clock control unit as discussed above with regard to one or more example embodiments. The memory card system 6000 according to at least some example embodiments of inventive concepts may adjust a data I/O speed using the clock control unit. According to at least some example embodiments, a frequency of a clock for data input/output of the flash memory 6230 may be lowered at relatively low (cold) temperatures (e.g., less than or equal to about −10° C.), may be set to a relatively high value (e.g., a maximum) at warmer temperatures (e.g., about 20° C. or between about −10° C. and about 85° C.), and may be lowered at relatively hot temperatures (e.g., greater than or equal to about 85° C.). Accordingly, performance of the memory card system 6000 may be improved and/or maximized, while reducing and/or minimizing operating errors thereof.

Figure 24:
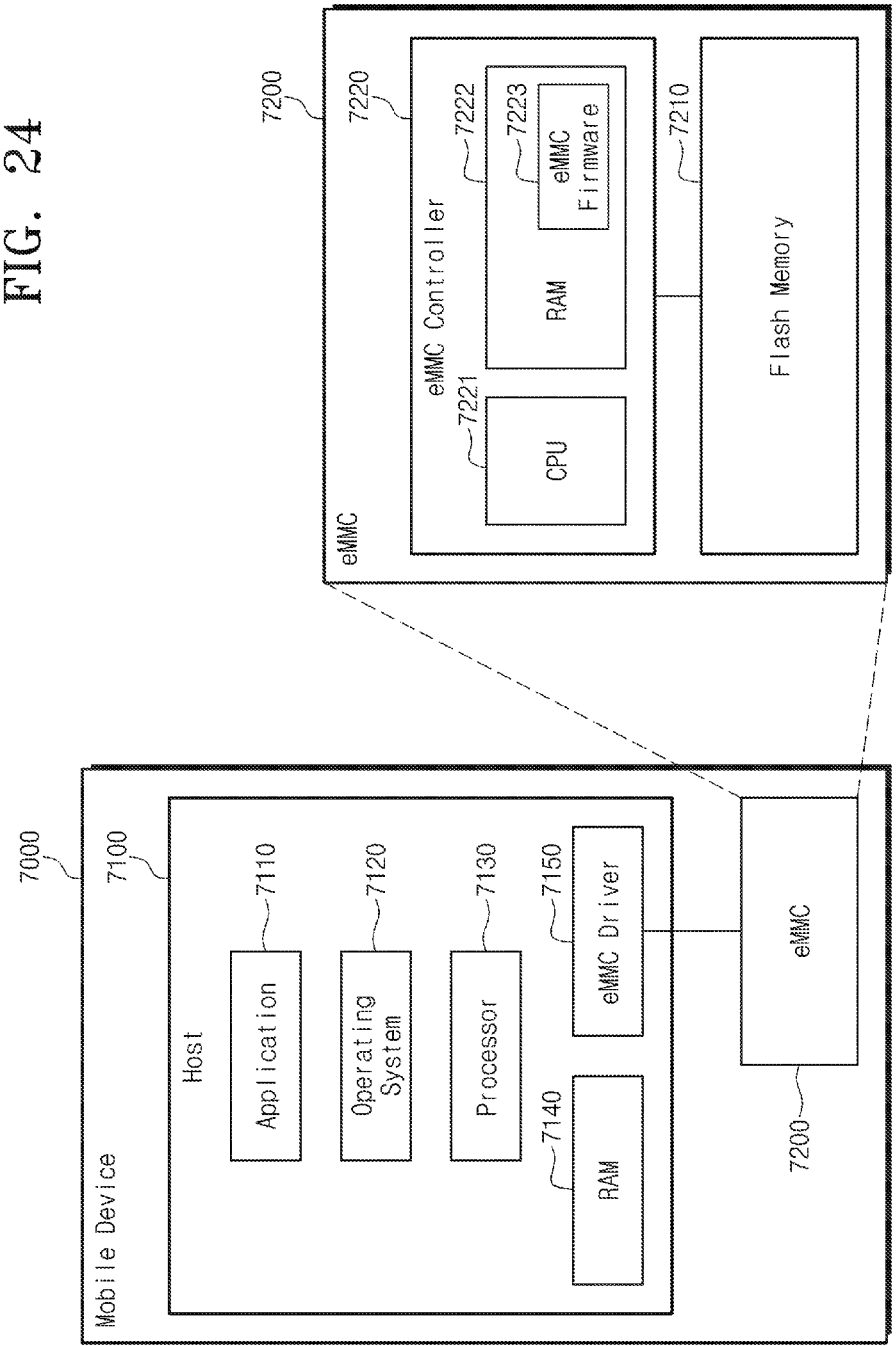
FIG. 24 is a block diagram schematically illustrating a mobile device including a storage device according to an example embodiment of inventive concepts.

FIG. 24 is a block diagram schematically illustrating a mobile device including a storage device according to an example embodiment of inventive concept.

Referring to FIG. 24, a mobile device 7000 includes a host 7100 and an embedded storage device 7200. In this example embodiment, the embedded storage device 7200 is implemented with an eMMC. The eMMC 7200 may be a memory card that is standardized by, for example, JEDEC, and may be implemented with an embedded type of portable MMC.

The host 7100 includes: an application 7110; an Operating System (OS) 7120; a processor 7130; a Random Access Memory (RAM) 7170; and an eMMC driver 7150.

As illustrated in FIG. 24, the eMMC 7200 includes a flash memory 7210 and an eMMC controller 7220. The eMMC controller 7220 includes a Central Processing Unit (CPU) 7221 and a Random Access Memory (RAM) 7222. The CPU 7221 may drive eMMC firmware 7223 using the RAM 7222.

The eMMC controller 7220 may include a clock control unit (not shown) according to an example embodiment. The mobile device 7000 according to at least this example embodiment may adjust a data I/O speed using the clock control unit. According to at least some example embodiments, a frequency of a clock for data input/output of the flash memory 7210 may be lowered at relatively low (cold) temperatures (e.g., less than or equal to about −10° C.), may be set to a relatively high value (e.g., a maximum) at warmer temperatures (e.g., about 20° C. or between about −10° C. and about 85° C.), and may be lowered at relatively hot temperatures (e.g., greater than or equal to about 85° C.). Accordingly, performance of a memory card system may be improved and/or maximized, while reducing and/or minimizing operating errors thereof.

Storage devices according to one or more example embodiments of inventive concepts may adjust a data I/O speed using a clock control unit. According to at least some example embodiments, a frequency of a clock for data input/output of the storage device may be decreased at relatively low (cold) temperatures, and increased or set higher at warmer temperatures, such as room temperature. Accordingly, performance of the storage device may be improved and/or maximized, while reducing and/or minimizing operating errors thereof.

While inventive concepts have been described with reference to some example embodiments, it will be apparent to those skilled in the art that various changes and modifications may be made without departing from the spirit and scope of inventive concepts. Therefore, it should be understood that the above-discussed example embodiments are not limiting, but illustrative.

What is claimed is:

1. A method for operating a NAND flash memory system, the method comprising:
   detecting a decrease in temperature of the NAND flash memory system below a first threshold temperature level; and
   adjusting an operating condition for a memory access operation in response to the detecting a decrease in temperature of the NAND flash memory system below a first threshold temperature level;
   wherein the operating condition includes a data I/O speed for the memory access operation; and
   wherein the adjusting includes decreasing the data I/O speed for the memory access operation from a first data I/O speed to a second data I/O speed in response to the detecting a decrease in temperature of the NAND flash memory system below a first threshold temperature level.

2. The method of claim 1, further comprising:
   detecting a further decrease in the temperature of the NAND flash memory system below a second threshold temperature level, the second threshold temperature level being less than the first threshold temperature level; and
   decreasing the data I/O speed from the second data I/O speed to a third data I/O speed in response to the detecting a further decrease in the temperature of the NAND flash memory system below a second threshold temperature level.

3. The method of claim 1, further comprising:
   detecting an increase in the temperature of the NAND flash memory system above the first threshold temperature level; and
   increasing the data I/O speed from the second data I/O speed to the first data I/O speed in response to the detecting an increase in the temperature of the NAND flash memory system above the first threshold temperature level.

4. The method of claim 1, wherein
   the operating condition further includes a read voltage level for the memory access operation; and
   the adjusting further includes increasing the read voltage level from a first read voltage level to a second read voltage level for the memory access operation in response to the detecting a decrease in temperature of the NAND flash memory system below a first threshold temperature level.

5. The method of claim 4, further comprising:
   detecting a further decrease in the temperature of the NAND flash memory system below a second threshold temperature level, the second threshold temperature level being less than the first threshold temperature level; and
   increasing the read voltage level from the second read voltage level to a third read voltage level in response to the detecting a further decrease in the temperature of the NAND flash memory system below a second threshold temperature level.

6. The method of claim 4, further comprising:
   detecting an increase in the temperature of the NAND flash memory system above the first threshold temperature level; and
   decreasing the read voltage level from the second read voltage level to the first read voltage level in response to the detecting an increase in the temperature of the NAND flash memory system above the first threshold temperature level.

7. The method of claim 1, wherein
   the operating condition further includes a drive strength for the NAND flash memory system; and
   the adjusting further includes increasing the drive strength from a first drive strength to a second drive strength in response to the detecting a decrease in temperature of the NAND flash memory system below a first threshold temperature level.

8. The method of claim 7, further comprising:
   detecting a further decrease in the temperature of the NAND flash memory system below a second threshold temperature level, the second threshold temperature level being less than the first threshold temperature level; and
   increasing the drive strength from the second drive strength to a third drive strength in response to the detecting a further decrease in the temperature of the NAND flash memory system below a second threshold temperature level.

9. The method of claim 7, further comprising:
   detecting an increase in the temperature of the NAND flash memory system above the first threshold temperature level; and
   decreasing the drive strength from the second drive strength to the first drive strength in response to the detecting an increase in the temperature of the NAND flash memory system above the first threshold temperature level.

10. A method for operating a memory system, the method comprising:
    adjusting a data I/O speed for a memory access operation based on temperature information associated with the memory system, wherein
       the adjusting decreases the data I/O speed to a first data I/O speed if the temperature information indicates that a temperature of the memory system is below a first threshold temperature level,
       the adjusting adjusts the data I/O speed to a second data I/O speed if the temperature information indicates that the temperature of the memory system is between the first threshold temperature level and a second threshold temperature level, and
       the adjusting decreases the data I/O speed to a third data I/O speed if the temperature information indicates that the temperature of the memory system is greater than the second threshold temperature level.

11. The method of claim 10, wherein the first data I/O speed and the third data I/O speed are less than the second data I/O speed.

12. The method of claim 10, wherein
    the memory access operation is a read operation; and
    the method further includes determining a read voltage for the read operation based on the data I/O speed.

13. The method of claim 12, wherein the determining determines the read voltage using a valley search operation.

14. A method for operating a NAND flash memory system, the method comprising:
    detecting a decrease in temperature of the NAND flash memory system below a first threshold temperature level;
    decreasing at least one of a clock frequency and a data I/O speed for a memory access operation in response to the detecting a decrease in temperature of the NAND flash memory system below a first threshold temperature level;

detecting a first error in performing a first iteration of the memory access operation;

adjusting, in response to the detecting a first error, an operating condition for a second iteration of the memory access operation, the operating condition being one of (i) a read voltage level for the memory access operation, and (ii) a drive strength for the NAND flash memory system; and performing the second iteration of the memory access operation according to the operating condition and the at least one of the clock frequency and the data I/O speed.

15. The method of claim 14, further comprising:

detecting a second error in the performing the second iteration of the memory access operation; and wherein the decreasing decreases the at least one of the clock frequency and the data I/O speed in response to the detecting a second error.

16. The method of claim 14, wherein the decreasing decreases the at least one of the clock frequency and the data I/O speed from a first level to a second level; and the method further includes detecting a decrease in the temperature of the NAND flash memory system below a second threshold temperature level, the second threshold temperature level being less than the first threshold temperature level; and decreasing the at least one of the clock frequency and the data I/O speed for the memory access operation from the second level to a third level in response to the detecting a decrease in the temperature of the NAND flash memory system below a second threshold temperature level.

17. The method of claim 14, wherein the decreasing decreases the at least one of the clock frequency and the data I/O speed from a first level to a second level; and the method further includes detecting an increase in the temperature of the NAND flash memory system above the first threshold temperature level; and increasing the at least one of the clock frequency and the data I/O speed from the second level to the first level in response to the detecting an increase in the temperature of the NAND flash memory system above the first threshold temperature level.

* * * * *